United States Patent
Lee et al.

(10) Patent No.: US 11,849,655 B2
(45) Date of Patent: Dec. 19, 2023

(54) SEMICONDUCTOR MEMORY DEVICES WITH ELECTRICALLY ISOLATED STACKED BIT LINES AND METHODS OF MANUFACTURE

(71) Applicant: Taiwan Semiconductor Manufacturing Co., Ltd., Hsinchu (TW)

(72) Inventors: Tung Ying Lee, Hsinchu (TW); Shao-Ming Yu, Zhubei (TW); Kai-Tai Chang, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 122 days.

(21) Appl. No.: 17/383,726

(22) Filed: Jul. 23, 2021

(65) Prior Publication Data

US 2022/0336742 A1    Oct. 20, 2022

Related U.S. Application Data

(60) Provisional application No. 63/174,627, filed on Apr. 14, 2021.

(51) Int. Cl.
*H10N 70/00* (2023.01)
*H10B 63/00* (2023.01)

(52) U.S. Cl.
CPC ......... *H10N 70/8418* (2023.02); *H10B 63/24* (2023.02); *H10N 70/011* (2023.02)

(58) Field of Classification Search
CPC ............. H10N 70/8418; H10N 70/011; H10N 70/068; H10N 70/231; H10N 70/823;
(Continued)

(56) References Cited

U.S. PATENT DOCUMENTS

2008/0112211 A1*  5/2008  Toda ................. G11C 8/08
                                                365/163
2010/0178729 A1   7/2010  Yoon et al.
(Continued)

FOREIGN PATENT DOCUMENTS

KR    20100083402 A    7/2010
KR    20140043262 A    4/2014
(Continued)

OTHER PUBLICATIONS

Kau et al., "A stackable cross point phase change memory," 2009 IEEE International Electron Devices Meeting (IEDM), Dec. 2009, 4 pages.

*Primary Examiner* — Jerome Leboeuf
(74) *Attorney, Agent, or Firm* — Slater Matsil, LLP

(57) ABSTRACT

A semiconductor device includes a memory structure over a substrate, wherein the memory structure includes a first word line; a first bit line over the first word line; a second bit line over the first bit line; a memory material over sidewalls of the first bit line and the second bit line; a first control word line along a first side of the memory material, wherein the first control word line is electrically connected to the first word line; a second control word line along a second side of the memory material that is opposite the first side; and a second word line over the second bit line, the first control word line, and the second control word line, wherein the second word line is electrically connected to the second control word line.

20 Claims, 35 Drawing Sheets

(58) Field of Classification Search
CPC .. H10N 70/8828; H10B 63/24; H10B 63/845; H10B 63/30; H10B 63/80
See application file for complete search history.

(56) References Cited

U.S. PATENT DOCUMENTS

| | | |
|---|---|---|
| 2013/0193398 A1 | 8/2013 | Pellizzer et al. |
| 2014/0027707 A1* | 1/2014 | Murooka ............... H10B 63/20 257/5 |
| 2014/0085961 A1 | 3/2014 | Kanamori et al. |
| 2014/0264244 A1 | 9/2014 | Hong et al. |
| 2015/0028280 A1 | 1/2015 | Sciarrillo et al. |
| 2015/0123067 A1* | 5/2015 | Lee ........................ H10B 63/84 257/4 |
| 2019/0393270 A1 | 12/2019 | Kim |
| 2020/0105780 A1* | 4/2020 | Lai ........................ H10B 43/40 |
| 2020/0328224 A1 | 10/2020 | Lai et al. |
| 2020/0395409 A1 | 12/2020 | Song et al. |

FOREIGN PATENT DOCUMENTS

| | | |
|---|---|---|
| KR | 20200142642 A | 12/2020 |
| TW | 201517214 A | 5/2015 |
| TW | 202038226 A | 10/2020 |

* cited by examiner

SEMICONDUCTOR MEMORY DEVICES WITH ELECTRICALLY ISOLATED STACKED BIT LINES AND METHODS OF MANUFACTURE

PRIORITY CLAIM AND CROSS-REFERENCE

This application claims the benefit of U.S. Provisional Application No. 63/174,627, filed on Apr. 14, 2021, which application is hereby incorporated herein by reference.

BACKGROUND

Semiconductor memories are used in integrated circuits for electronic applications, including radios, televisions, cell phones, and personal computing devices, as examples. One type of semiconductor memory is resistive random access memory (RRAM), which involves storing values in resistance changing materials. Resistance changing materials can be switched between a low resistance phase and a high resistance phase to indicate bit codes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
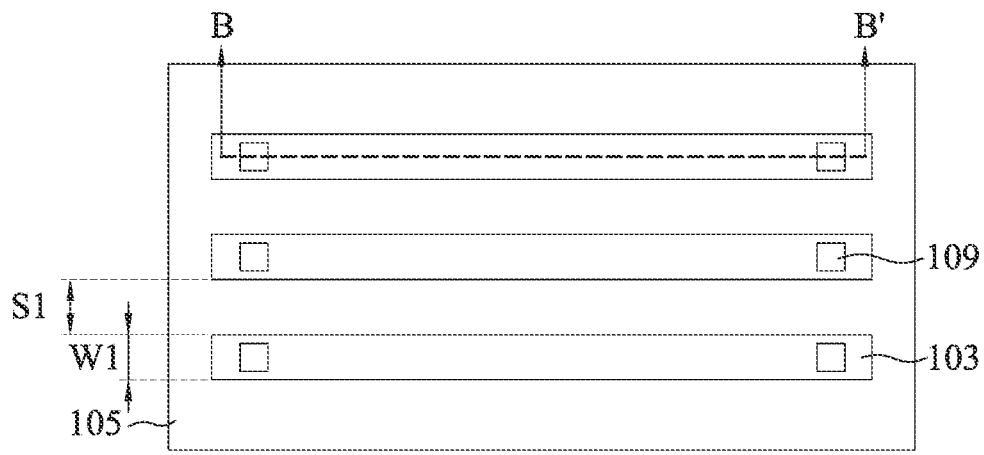
FIGS. 1A and 1B illustrate a plan view and a cross-sectional view of an intermediate step in the manufacture of first word lines of a memory device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular embodiments in which resistive random access memory (RRAM) devices include an array of memory structures that have two vertically stacked bit lines and two vertically stacked word lines. The bit lines may be disposed between the word lines, and the word lines are connected to control word lines that extend over opposite sides of the bit lines. In this manner, each memory structure comprises four independently controllable memory cells. A memory structure such as those described herein may allow for increased memory cell density of a memory array without increasing the area of the memory array, in some cases. Additionally, some embodiments herein describe memory structures in which each memory cell includes an electrode with a protruding tip, in which the electrode is connected to a bit line. In some cases, the protruding tip of the electrode causes a more localized electrical field during device operation, which can cause the physical mechanism of the resistive memory to occur in a more localized region near the protruding tip. This can improve device reproducibility, more uniformity of memory cell operation, and more consistent operation of the memory cells.

FIGS. 1A through 14 illustrate intermediate steps in the formation of a semiconductor device 350 (see FIG. 14) comprising a memory structure 250 (see FIGS. 12A-12C), in accordance with some embodiments. In FIGS. 1A through 12B, figures ending with an "A" designation are plan views illustrated along the cross-section A-A' shown in the corresponding figure with a "B" designation. Similarly, figures ending with a "B" designation are illustrated along the cross-section B-B' shown in the corresponding figure with the "A" designation. For example, FIG. 1A illustrates a top-down plan view of the structure shown in FIG. 1B at the cross-section A-A' indicated in FIG. 1B, and FIG. 1B illustrates a cross-sectional view of the structure shown in FIG. 1A along the cross-section B-B' indicated in FIG. 1A.

Figure 1B:
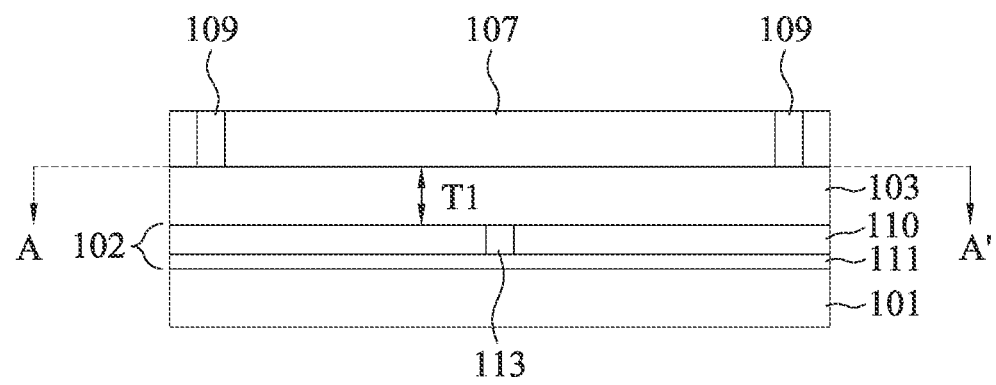

Turning first to FIGS. 1A-1B, a first word line 103 is formed over a substrate 101, in accordance with some embodiments. The substrate 101 may be a semiconductor substrate, such as a bulk semiconductor, a semiconductor-on-insulator (SOI) substrate, or the like, which may be doped (e.g., with a p-type or an n-type dopant) or undoped. The substrate 101 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 101 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In addition, the substrate 101 may include active devices (not separately illustrated) formed within and/or over the substrate 101 and may include first metallization layers 102 over the active devices. As one of ordinary skill in the art will recognize, the active devices may comprise a wide variety of active devices and passive devices such as transistors, capacitors, resistors, the like, or combinations thereof. The active devices may be used to generate the desired structural and functional requirements of the design for a semiconductor device and may be formed using any suitable techniques. For example, the active devices may comprise one or more devices such as diodes, photodiodes, fuses, Complementary Metal-Oxide Semiconductor (CMOS) transistors, Fin Field Effect Transistors (FinFETs), Nanostructure (e.g., nanosheet, nanowire, gate-all-around, or the like) Field Effect Transistors (NSFETs), the like, or combinations thereof.

The first metallization layers 102 are formed over the active devices and may connect the various active devices to form functional circuitry. In an embodiment, the first metallization layers 102 comprise alternating layers of dielectric material and conductive material and may be formed using any suitable techniques (e.g., deposition, damascene, dual damascene, or the like). The dielectric layers may be inter-metal dielectric layers (IMDs), and one or more of the dielectric layers may be low-k dielectric material, non-low-k dielectric material, oxide, nitride, polymer, the like, or combinations thereof. In some embodiments, one or more of the dielectric layers may be formed of a material similar to that of the first dielectric layer 105, described below.

The conductive layers may be metallization patterns, and may include conductive features interconnected to each other and embedded in the one or more dielectric layers. The conductive features may include multi-layers of conductive lines, conductive vias, and/or conductive contacts. The conductive vias may be formed in the dielectric layers to electrically connect the conductive lines in different layers. The conductive material may comprise one or more metals, metal alloys, or a combination thereof, and may be deposited using suitable techniques. As a representative example, the first metallization layers 102 are shown in FIGS. 1A-1B as including a conductive line 111, a dielectric layer 110 overlying the conductive line 111, and a conductive via 113 extending through the dielectric layer 110 to electrically connect the conductive line 111. In some embodiments, the conductive line 111 may be part of a logic circuit or another type of circuit. For example, the first metallization layers 102 may have four metallization layers, and the conductive line may be part of the fourth metallization layer, though the first metallization layers 102 may have any suitable number of metallization layers. These are examples, any suitable number of conductive layers, dielectric layers, or conductive vias may be utilized.

The first word lines 103 of the memory structure 250 may be formed over the first metallization layers 102, in accordance with some embodiments. In some embodiments, the first word lines 103 may be electrically connected to the first metallization layers 102 by the conductive via 113. The first word lines 103 may be formed, for example, by first forming a first dielectric layer 105 over the first metallization layers 102. The first dielectric layer 105 may comprise one or more dielectric materials such as doped or undoped silicon oxide, silicon nitride, silicon oxynitride, silicon carbide, doped silicate glass, flowable oxide, other high-k materials, low-k materials, the like, or combinations thereof. In an embodiment, the first dielectric layer 105 comprises a material such as boron phosphorous silicate glass (BPSG), although any suitable dielectrics may be used, which may include those described above for the dielectric layers of the first metallization layers 102. The first dielectric layer 105 may be formed using any suitable process, such as CVD, PVD, PECVD, ALD, or the like. In some embodiments, the first dielectric layer 105 is planarized using a chemical mechanical polishing (CMP) process, a grinding process, or the like.

After forming the first dielectric layer 105, the first word lines 103 may be formed within the first dielectric layer 105, in some embodiments. In this manner, the first dielectric layer 105 may surround and isolate the first word lines 103. As an example process, the first word lines 103 may be formed by forming openings within the first dielectric layer 105 and depositing conductive material within the openings.

The openings may be formed using a suitable photolithography and etching process, for example. In some embodiments, the conductive material includes an optional liner layer and a conductive fill material over the liner layer. The liner layer may be a diffusion barrier layer, an adhesion layer, or the like, and may comprise one or more layers of titanium, titanium nitride, tantalum, tantalum nitride, molybdenum, ruthenium, rhodium, hafnium, iridium, niobium, rhenium, tungsten, cobalt, aluminum, copper, alloys of these, oxides of these, the like, or combinations thereof. The liner layer may be deposited using a suitable process, such as plating, CVD, PVD, PECVD, ALD, or the like.

After depositing the liner layer (if present), the conductive fill material is deposited to fill the remainder of the opening in the first dielectric layer 105, forming the first word lines 103. The conductive fill material may comprise one or more conductive materials such as tungsten, cobalt, aluminum, nickel, copper, silver, gold, molybdenum, ruthenium, molybdenum nitride, alloys thereof, the like, or combinations thereof. The conductive fill material may be deposited using a suitable process, such as plating, CVD, PVD, PECVD, ALD, or the like. In some embodiments, a planarization process (e.g., CMP and/or grinding) may be performed to remove excess conductive material.

In other embodiments, the first word lines 103 may be formed using other techniques. For example, the conductive material of the first word lines 103 may be deposited over the first metallization layers 102 and then patterned using suitable photolithography and etching techniques to form the first word lines 103. The material of the first dielectric layer 105 may then be deposited over the first word lines 103. A planarization process may then be performed to remove excess material. These and all other suitable techniques are fully intended to be within the scope of the present disclosure. In some embodiments, the first word lines 103 may be formed having a thickness T1 in the range of about 80 nm to about 180 nm or a width W1 in the range of about 40 nm to about 80 nm. In some embodiments, adjacent first word lines 103 may be spaced apart a distance S1 that is in the range of about 40 nm to about 80 nm. Other shapes, dimensions, thicknesses, widths, or distances are possible, and the first word lines 103 may have a different number or arrangement than shown.

In some embodiments, a second dielectric layer 107 may be formed over the first word lines 103, and first vias 109 may be formed extending through the second dielectric layer 107 to electrically connect the first word lines 103. The second dielectric layer 107 may be formed using similar materials and similar processes as the first dielectric layer 105 described above. However, any suitable materials or techniques may be utilized.

In some embodiments, the first vias 109 may be formed using materials and processes similar to the first word lines 103, described above. For example, the first vias 109 may be formed by forming openings in the second dielectric layer 107, filling the openings with conductive material, and then performing a planarization process to remove excess conductive material. However, any suitable materials or techniques may be utilized. In some embodiments, the first vias 109 may have a thickness in the range of about 30 nm to about 100 nm, and may have a width or length in the range of about 40 to about 80 nm. Other shapes, dimensions, thicknesses, widths, lengths, or distances are possible, and the first vias 109 may have a different number or arrangement than shown.

Figure 2A:
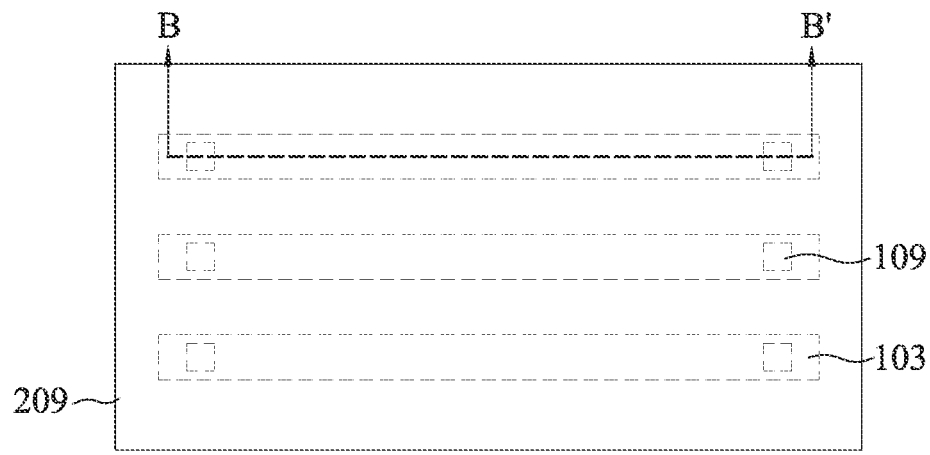
FIGS. 2A, 2B, 3A, and 3B illustrate plan views and cross-sectional views of intermediate steps in the manufacture of bit line stacks of a memory structure, in accordance with some embodiments.
Figure 2B:
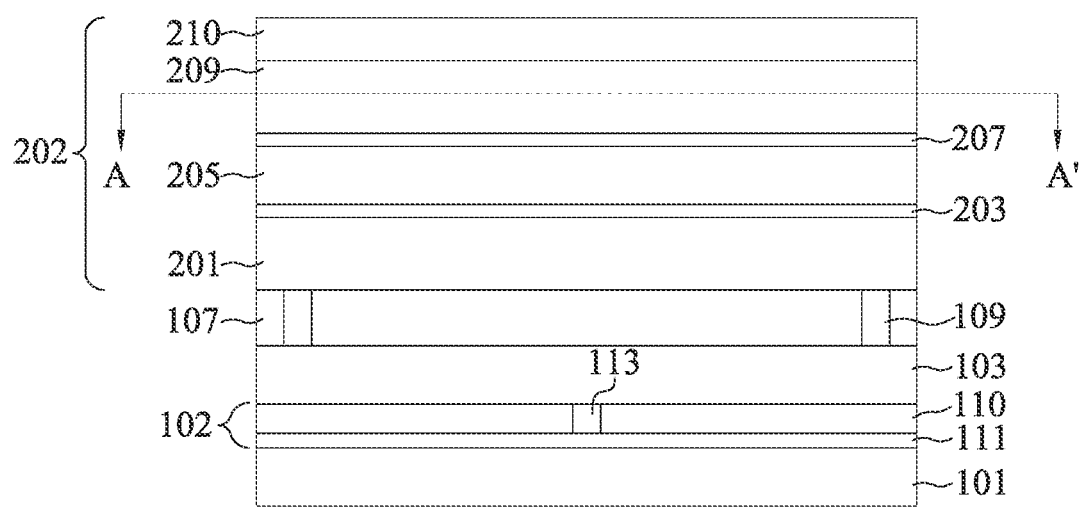

FIGS. 2A-2B illustrate the deposition of bit line layers 202, in accordance with some embodiments. The bit line layers 202 are subsequently patterned to form first bit lines 201 and second bit lines 209 (see FIGS. 3A-3B) of the memory structure 250 (see FIGS. 12A-12C), in accordance with some embodiments. In some embodiments, the bit line layers 202 may include first bit line material 201, first adhesion layer 203, insulating layer 205, second adhesion layer 207, and second bit line material 209. The first bit line material 201 may comprise conductive material such as tungsten, cobalt, aluminum, nickel, copper, silver, gold, alloys thereof, the like, or combinations thereof. The conductive material may be deposited using acceptable processes such as plating, CVD, PVD, PECVD, ALD, or the like. However, any suitable materials or deposition techniques may be utilized. In some embodiments, the first bit line material 201 may have a thickness in the range of about 30 nm to about 50 nm, though other thicknesses are possible.

The first adhesion layer 203 may then be deposited on the first bit line material 201 to improve adhesion between the first bit line material 201 and the overlying insulating layer 205, in accordance with some embodiments. The first adhesion layer 203 may comprise titanium, titanium nitride, tantalum, tantalum nitride, carbon, the like, or combinations thereof. The first adhesion layer 203 may be deposited using acceptable processes such as plating, CVD, PVD, PECVD, ALD, or the like. However, any suitable materials or deposition techniques may be utilized. In some embodiments, the first adhesion layer 203 may have a thickness in the range of about 2 nm to about 5 nm, though other thicknesses are possible.

The insulating layer 205 may then be deposited on the first adhesion layer 203, in accordance with some embodiments. The insulating layer 205 electrically isolates the first bit lines 201 from the second bit lines 209 (see FIGS. 3A-3B). The insulating layer 205 may be a material similar to those described previously for the first dielectric layer 105, in some embodiments. For example, the insulating layer 205 may be an oxide material, though other materials are possible. The insulating layer 205 may be deposited using acceptable processes such as those described previously for the first dielectric layer 105. However, any suitable materials or deposition techniques may be utilized. In some embodiments, the insulating layer 205 may have a thickness in the range of about 20 nm to about 30 nm, though other thicknesses are possible.

The second adhesion layer 207 may then be deposited on the insulating layer 205, in accordance with some embodiments. The second adhesion layer 207 may provide improved adhesion between the insulating layer 205 and the overlying second bit line material 209. The second adhesion layer 207 may comprise materials similar to those described for the first adhesion layer 203, and may be deposited using similar processes. For example, the second adhesion layer 207 may have a thickness in the range of about 2 nm to about 5 nm, though other thicknesses are possible.

The second bit line material 209 may then be deposited on the second adhesion layer 207, in accordance with some embodiments. The second bit line material 209 may comprise materials similar to those described for the first bit line material 201, and may be deposited using similar processes. For example, the second bit line material 209 may have a thickness in the range of about 30 nm to about 50 nm, though other thicknesses are possible.

In some embodiments, a hard mask 210 may be deposited over the bit line layers 202 for use during subsequent patterning steps. The hard mask 210 may be a material such as silicon nitride, silicon oxide, silicon oxynitride, SiCON, SiC, SiOC, the like, or combinations thereof. The hard mask 210 may be deposited using suitable processes, such as CVD, PVD, ALD, or the like. In some embodiments, the hard mask 210 may have a thickness in the range of about 5 nm to about 30 nm, though other thicknesses are possible.

Figure 3A:
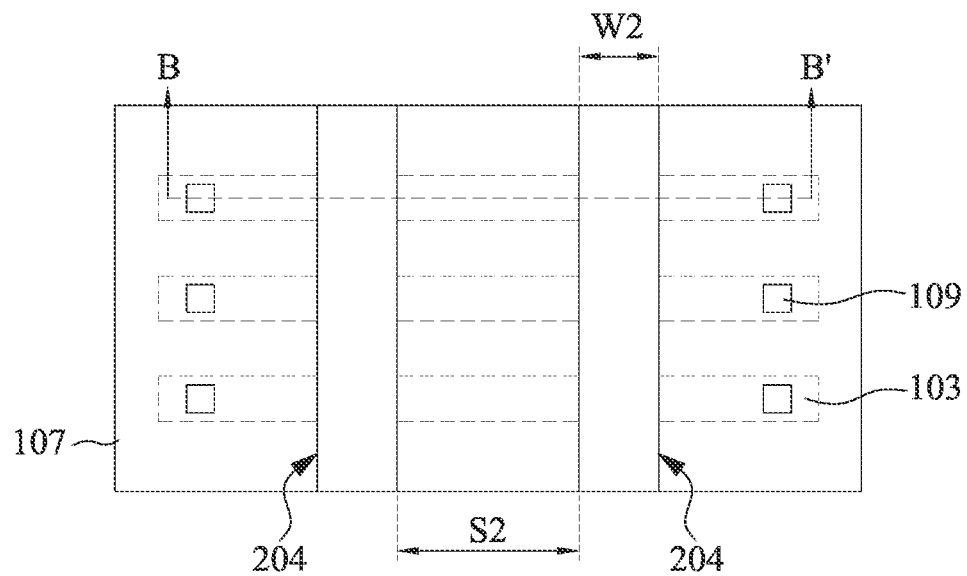
Figure 3B:
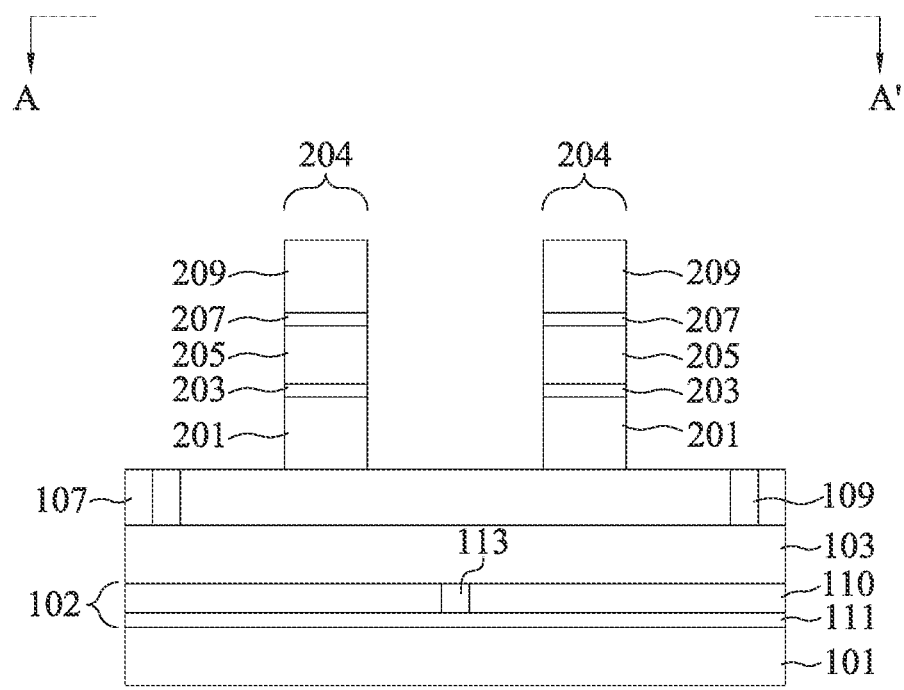

FIGS. 3A-3B illustrate a patterning of the bit line layers 202 to form bit line stacks 204, in accordance with some embodiments. The bit line stacks 204 comprise first bit lines 201 formed from the first bit line material 201 and second bit lines 209 formed from the second bit line material 209, in accordance with some embodiments. The first bit lines 201 and second bit lines 209 may be formed, for example, by patterning the bit line layers 202 using suitable photolithographic masking and etching processes. For example, a photoresist (not illustrated in the figures) may be formed over the hard mask 210 (see FIGS. 2A-2B) and patterned using acceptable photolithography techniques. The pattern of the photoresist may then be transferred to the hard mask 210 using an acceptable etching process, such as wet etching, dry etching, reactive ion etching (RIE), neutral beam etching (NBE), the like, or a combination thereof. The etching process may be anisotropic. In some embodiments, the photoresist may then be removed using an ashing process, for example.

The pattern of the hard mask 210 may then be transferred to the bit line layers 202 using one or more acceptable etching processes, such as wet etching, dry etching, RIE, NBE, the like, or a combination thereof. The etching processes may be anisotropic. In this manner, the pattern of the hard mask 210 is extended through the bit line layers 202, patterning the first bit line material 201 to define the first bit lines 201 and patterning the second bit line material 209 to define the second bit lines 209. In some embodiments, one or more layers of the bit line layers 202 may be etched using a different etching process than one or more other layers of the bit line layers 202. In some embodiments, the hard mask 210 may be removed by the etching processes. In other embodiments, the hard mask 210 may be removed after patterning the bit line layers. For example the hard mask 210 may be removed using a wet etching process, a dry etching process, a planarization process, the like, or a combination thereof. In other embodiments, the hard mask 210 is not removed and remains on the bit line stacks 204. An embodiment process in which the hard mark 210 is not removed is described below for FIGS. 15A through 17B.

In this manner, bit line stacks 204 may be formed, in accordance with some embodiments. Each bit line stack 204 comprises a first bit line 201 and a second bit line 209. Each first bit line 201 is separated and isolated from a respective second bit line 209 by an insulating layer 205. In some embodiments, the bit line stacks 204 have a thickness that is in the range of about 100 nm to about 200 nm. Adjacent bit line stacks 204 may be separated by a distance S2 that is in the range of 45 nm to about 100 nm. In some embodiments, the bit line stacks 204 have a width W2 that is in the range of about 40 nm to about 80 nm. Other thicknesses, distances, or widths are possible. In some embodiments, the bit line stacks 204 may have substantially vertical sidewalls, as shown in FIG. 3B. In other embodiments, the bit line stacks 204 may have sloped sidewalls, tapered sidewalls, convex sidewalls, concave sidewalls, or sidewalls having another profile than these examples. As shown in FIGS. 3A-3B, in some embodiments, a pair of bit line stacks 204 may be formed between a pair of first vias 109, though other arrangements or configurations of bit line stacks 204 or first vias 109 are possible.

Figure 4A:
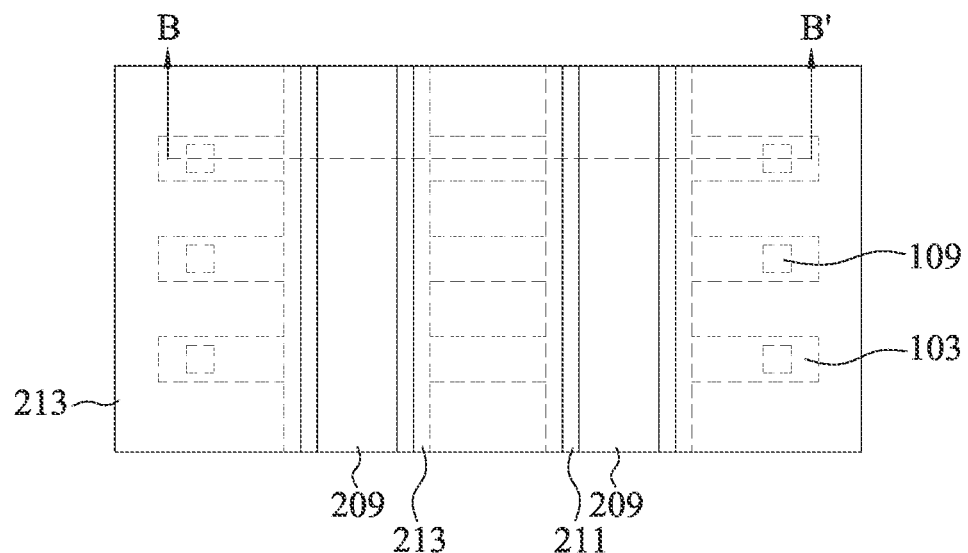
FIGS. 4A, 4B, 5A, and 5B illustrate plan views and cross-sectional views of intermediate steps in the manufacture of memory stacks of a memory structure, in accordance with some embodiments.
Figure 4B:
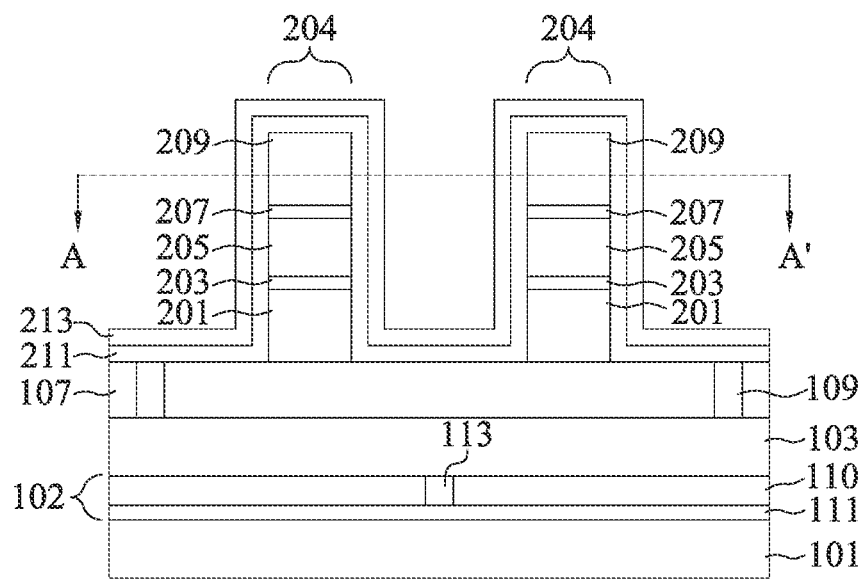

FIGS. 4A-4B illustrate the deposition of a memory material 211 and a selector material 213 over the bit line stacks 204, in accordance with some embodiments. The memory material 211 may be, for example, a resistive memory material suitable for storing digital values (e.g., 0 or 1), such as a Resistive Random Access Memory (RRAM or ReRAM) material, a PCRAM material, a CBRAM material, or the like. In some embodiments, the resistance of the memory material 211 may be controlled by the application of appropriate voltages and/or currents across the memory material 211. For example, the memory material 211 may be controlled to be in either a high resistance state or a low resistance state. Depending on a resistance state of the memory material 211, a current flowing through the memory material 211 varies, and a corresponding digital value can be stored. The type and physical mechanism of the memory structure 250 (see FIGS. 12A-12C) may depend on the particular material of the memory material 211. For example, some types of memory material 211 may be set to a particular resistance state by applying an electric field across the memory material 211 (e.g., by controlling a voltage across the memory material 211), and other types of memory material 211 may be set to a particular resistance state by heating the memory material 211 (e.g., by controlling current through the memory material 211).

In some embodiments, the memory material 211 may comprise a metal-containing high-k dielectric material, such as a metal oxide. The metal may be a transitional metal. In some embodiments, memory material 211 comprises $HfO_x$, $ZrO_x$, $TaO_x$, $TiO_x$, $VO_x$, $NiO_x$, $NbO_x$, $LaO_x$, $CuO_x$, the like, or a combination thereof. In other embodiments, the memory material 211 comprises $AlO_x$, $SnO_x$, $GdO_x$, IGZO, $Ag_2S$, the like, or a combination thereof. In other embodiments, the memory material 211 comprises a chalcogenide material such as $GeS_2$, GeSe, AgGeSe, GeSbTe, doped GeSbTe (e.g., doped with N, Si, C, Ga, In, the like, or a combination thereof), the like, or a combination thereof. In some embodiments, the memory material 211 may be deposited as a conformal film. The memory material 211 may be deposited by CVD, PVD, ALD, PECVD, or the like. These are examples, and other materials or other deposition techniques are possible, and all are also considered within the scope of the present disclosure. In some embodiments, the memory material 211 is deposited on surfaces to a thickness that is in the range of about 5 nm to about 15 nm, though other thicknesses are possible.

The selector material 213 is then deposited over the memory material 211, in accordance with some embodiments. In other embodiments, the memory material 211 is patterned before depositing the selector material 213, an example embodiment of which is described below for FIGS. 18A-22B. In some embodiments, the selector material 213 is a material that exhibits an ovonic threshold switching (OTS) effect or similar effect. In some embodiments, the selector material 213 comprises a chalcogenide material that includes at least a chalcogen anion (e.g., selenium, tellurium, or the like) and an electropositive element (e.g., germanium, silicon, phosphorus, arsenic, antimony, bismuth, zinc, nitrogen, boron, carbon, or the like). For example, the chalcogenide material may be $GeSb_2Te_5$ (GST), although other chalcogenide materials may also be utilized. In some embodiments, the selector material 213 may be deposited as a conformal film. The selector material 213 may be deposited by CVD, PVD, ALD, PECVD, or the like. These are examples, and other materials or other deposition techniques are possible, and all are also considered within the scope of the present disclosure. In some embodiments, the selector material 213 is deposited on surfaces to a thickness that is in the range of about 10 nm to about 30 nm, though other thicknesses are possible.

Figure 5A:
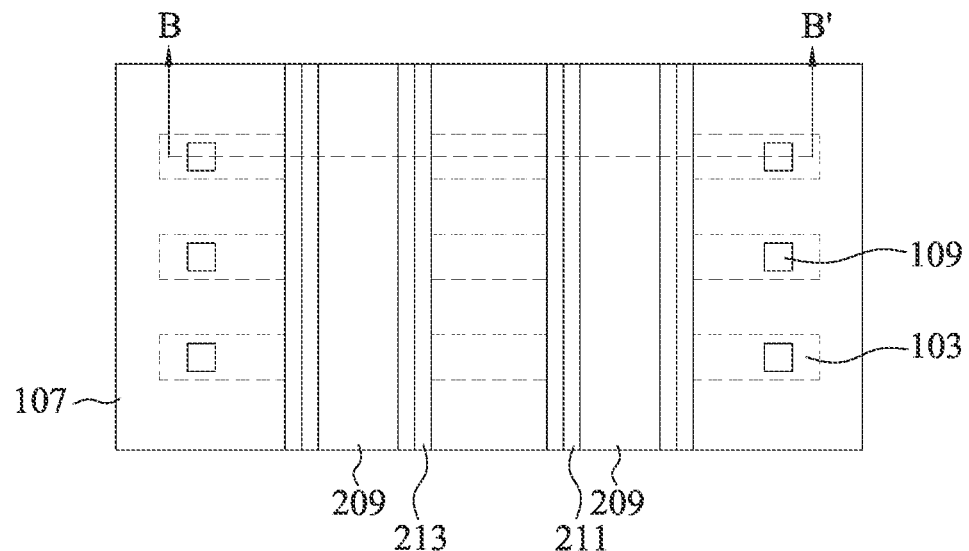
Figure 5B:
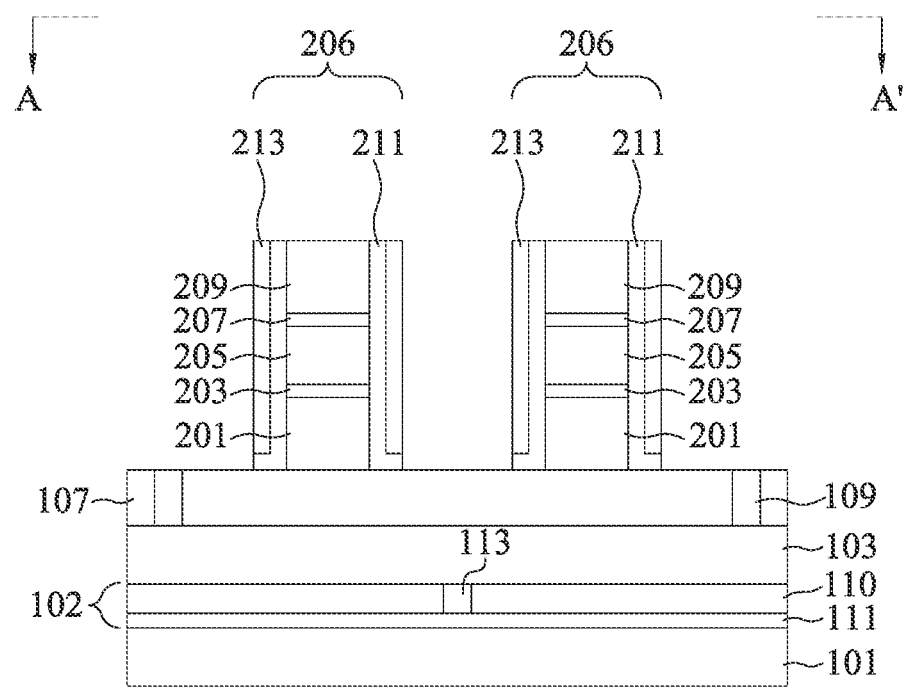

In FIGS. 5A-5B, one or more etching processes are performed to remove portions of memory material 211 and selector material 213 to form memory stacks 206, in accordance with some embodiments. The one or more etching process may remove memory material 211 and selector material 213 from horizontal surfaces and leave portions of memory material 211 and selector material 213 remaining on sidewalls of the bit line stacks 204, in accordance with some embodiments. In this manner, the memory material 211 and selector material 213 on one bit line stack 204 is isolated from the memory material and selector material 213 on an adjacent bit line stack 204. The bit line stacks 204 and the remaining memory material 211 and selector material 213 form the memory stacks 206. The remaining memory material 211 and selector material 213 may cover some or all of opposite sidewalls of the first bit lines 201 and may cover some or all of opposite sidewalls of the second bit lines 209. In some cases, the memory material 211 remaining on the sidewalls of the bit line stacks 204 may be considered "memory spacers," and the selector material 213 remaining on the sidewalls of the bit line stacks 204 may be considered "selector spacers." As shown in FIG. 5B, the remaining memory material 211 may have an "L-shaped" profile in cross-section, in some embodiments. The one or more etching processes may include, for example, wet etching, dry etching, RIE, NBE, the like, or a combination thereof. The etching processes may be anisotropic.

Figure 6A:
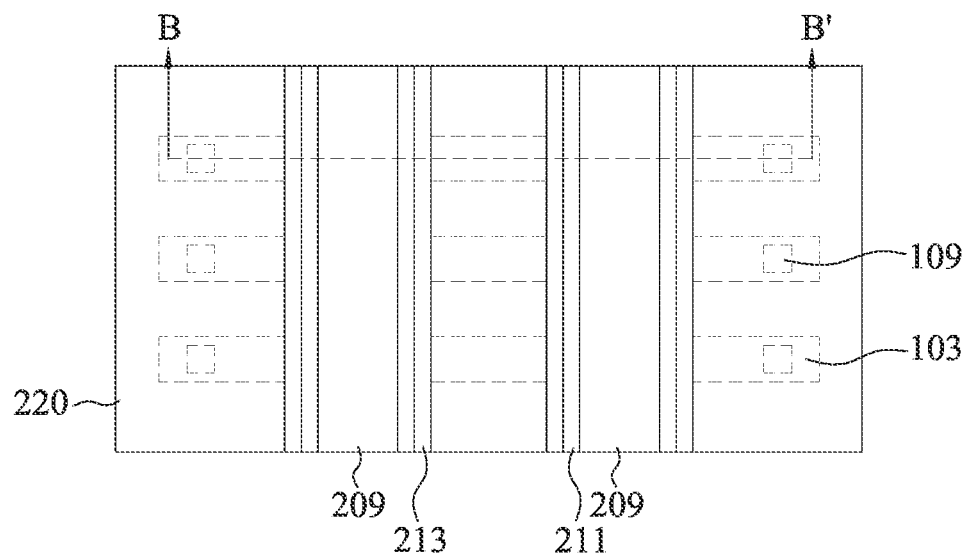
FIGS. 6A, 6B, 7A, and 7B illustrate plan views and cross-sectional views of intermediate steps in the manufacture of control word lines of a memory structure, in accordance with some embodiments.
Figure 6B:
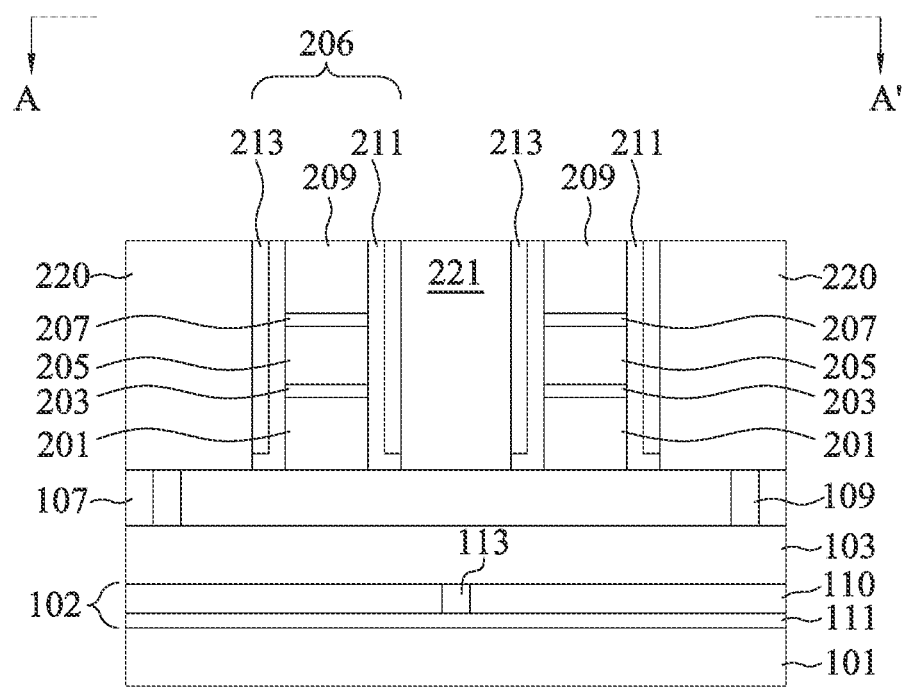

In FIGS. 6A-6B, conductive material 220 is deposited over the memory stacks 206, in accordance with some embodiments. The conductive material 220 may include one or more materials similar to those described previously for the first word line 103 (see FIGS. 1A-1B), in some embodiments. The conductive material 220 may also be deposited using techniques similar to those described previously for the first word line 103. Other materials or techniques are possible. In some embodiments, a planarization process (e.g., CMP and/or grinding) may be performed to remove excess conductive material 220. After planarization, top surfaces of the conductive material 220, second bit lines 209, memory material 211, and selector material 213 may be approximately level. In some embodiments, the planarization process may also remove excess portions of the memory material 211 and/or selector material 213.

Figure 7A:
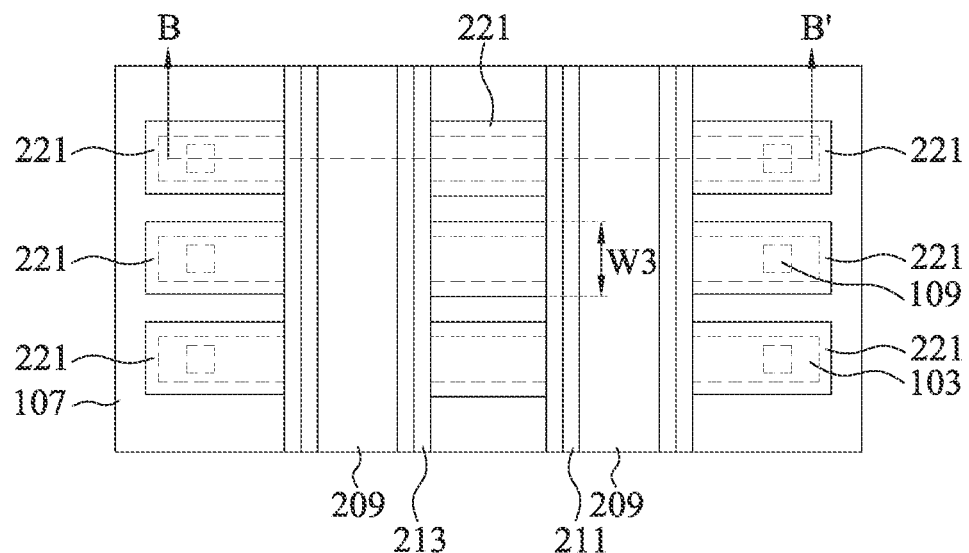
Figure 7B:
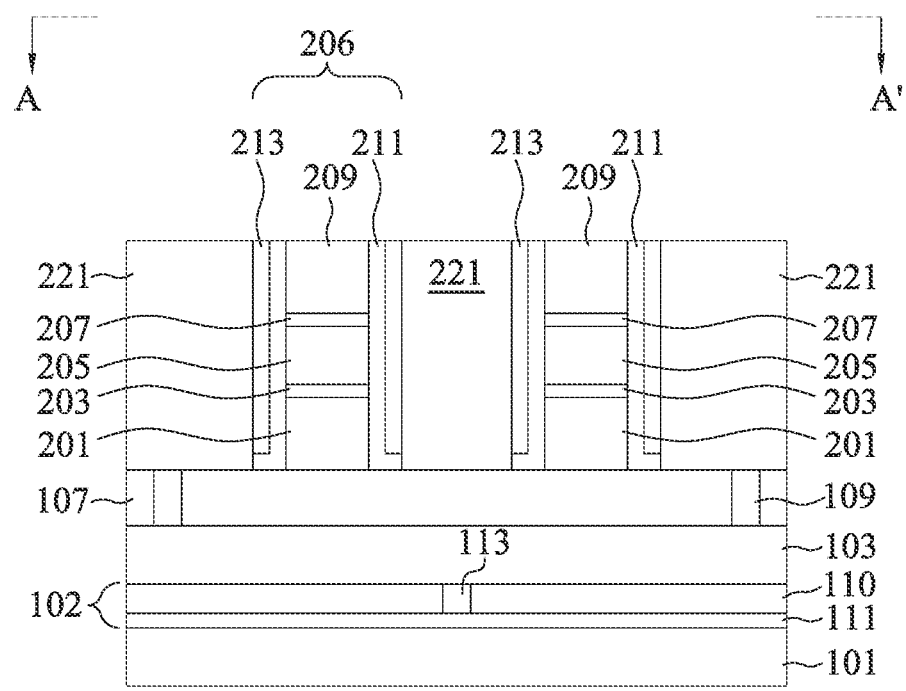

FIGS. 7A-7B illustrate the patterning of the conductive material 220 to form control word lines 221, in accordance with some embodiments. The conductive material 220 may be patterned, for example, using suitable photolithography and etching techniques, such as those described previously. In some embodiments, the control word lines 221 may be formed over the first word lines 103, as shown in FIG. 7A. In some embodiments, the control word lines 221 may have a width W3 that is larger than the width W1 of the first word lines 103 (see FIGS. 1A-1B), but in other embodiments, the width W3 may be about the same as or smaller than the width W1. In some embodiments, the control word lines 221 have a width W3 that is in the range of about 40 nm to about 80 nm, though other widths are possible.

In some embodiments, some of the control word lines 221 may extend from the sidewall of one memory stack 206 to the sidewall of an adjacent memory stack 206. In this manner, some control word lines 221 may extend on the sidewalls of two adjacent memory stacks 206, and some control word lines 221 may extend on the sidewall of a single memory stack 206. For example, in some embodiments, the control word lines 221 at the opposite ends of a first word line 103 may each extend on a single respective memory stack 206, and other the control word lines 221 along the first word line 103 may each extend on two adjacent memory stacks 206. Other configurations or arrangements are possible. In some embodiments, some of the control word lines 221 are formed over first vias 109 and are electrically connected to corresponding first word lines 103 by the first vias 109. As shown in FIGS. 7A-7B, other control word lines 221 are not formed over first vias 109 and are thus electrically isolated from the first word lines 103. In some embodiments, the control word lines 221 formed over a first word line 103 may be alternatingly connected to or isolated from that first word line 103. In this manner, the formation of control word lines 221 allows memory cells 260 (see FIGS. 12C-D) on either side of the memory stacks 206 to be controlled.

Figure 8A:
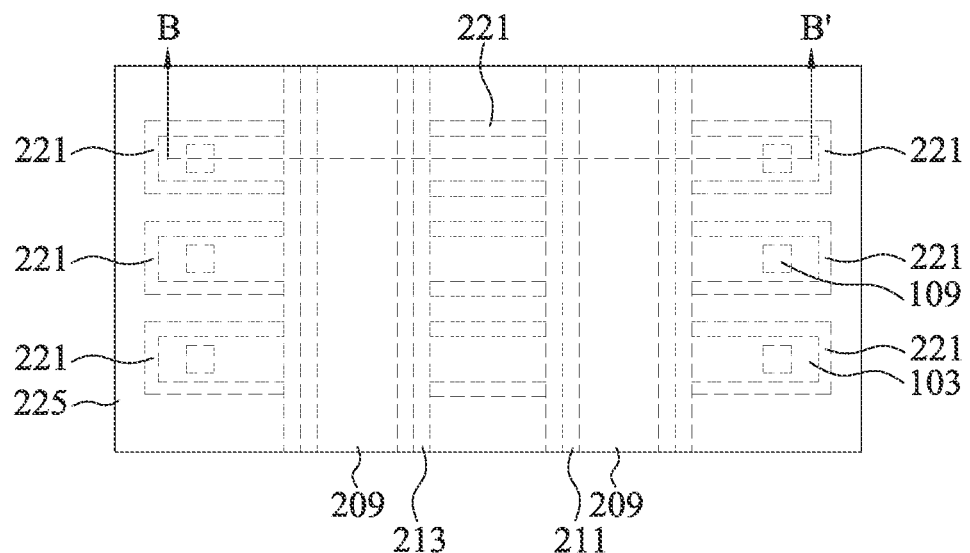
FIGS. 8A, 8B, 9A, 9B, 10A, 10B, 11A, and 11B illustrate plan views and cross-sectional views of intermediate steps in the manufacture of second word lines of a memory structure, in accordance with some embodiments.
Figure 8B:
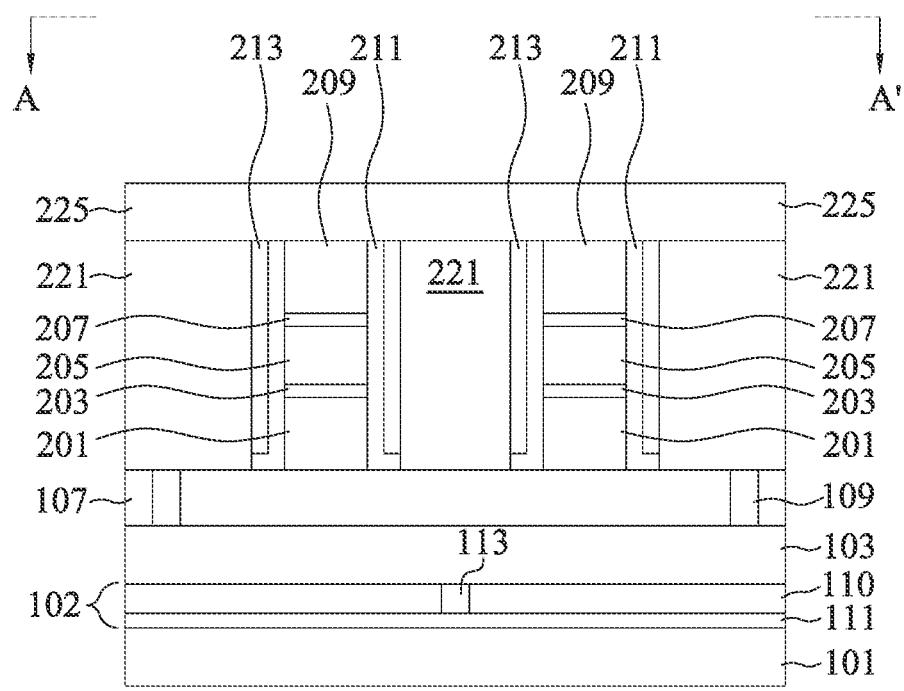

In FIGS. 8A-8B, a third dielectric layer 225 is deposited over the control word lines 221, in accordance with some embodiments. The third dielectric layer 225 may extend over and between the control word lines 221. In this manner, the third dielectric layer 225 may surround and separate the control word lines 221 to isolate the control word lines 221. The third dielectric layer 225 may be a material similar to the first dielectric layer 105 or the second dielectric layer 107, and may be formed using similar techniques. In some embodiments, a planarization process (e.g., CMP and/or grinding) may be performed after depositing the third dielectric layer 225. In some embodiments, the third dielectric layer 225 has a thickness that is in the range of about 15 nm to about 40 nm, though other thicknesses are possible.

Figure 9A:
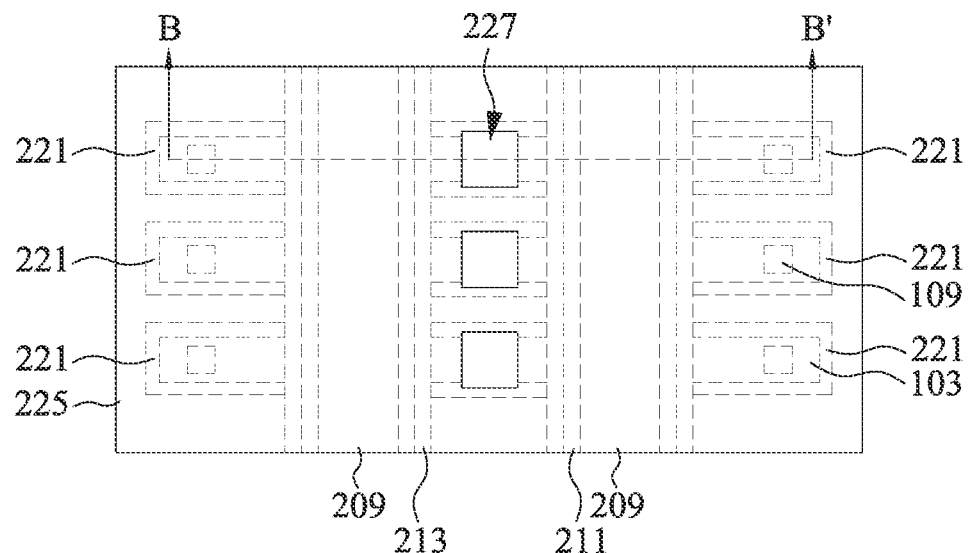
Figure 9B:
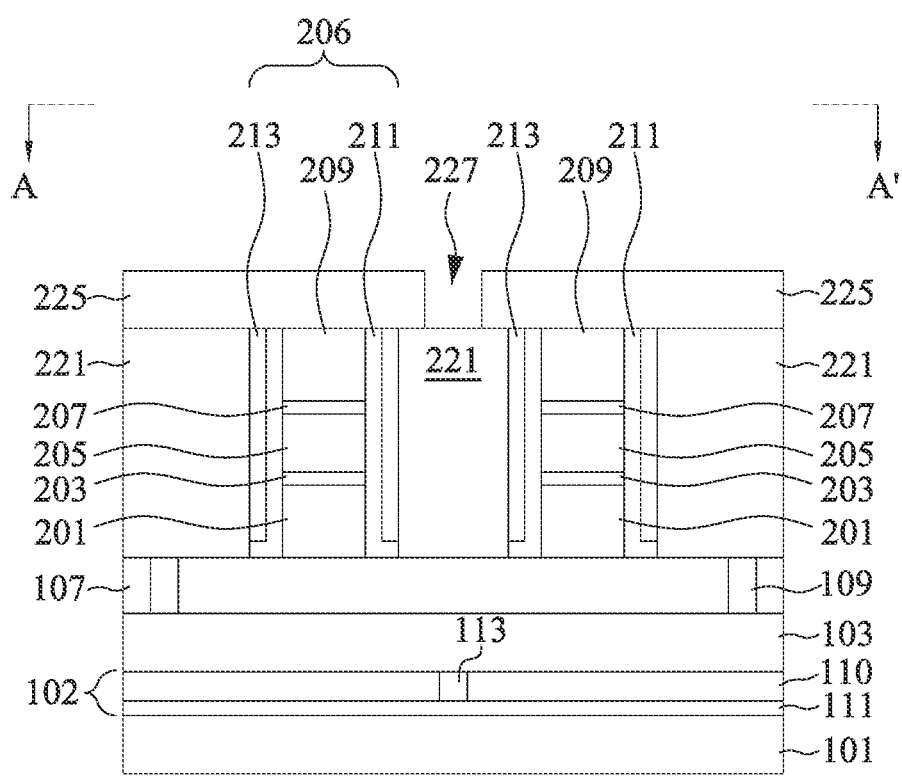

In FIGS. 9A-9B, openings 227 are patterned in the third dielectric layer 225, in accordance with some embodiments. The openings 227 may expose portions of the control word lines 221. In some embodiments, the openings 227 expose portions of those control word lines 221 that are isolated from the first word lines 103 (e.g., those control word lines 221 not formed over the first vias 109). The openings 227 may be patterned using suitable photolithography and etching techniques. The openings 227 may have dimensions larger than, about the same as, or smaller than the dimensions of the first vias 109.

Figure 10A:
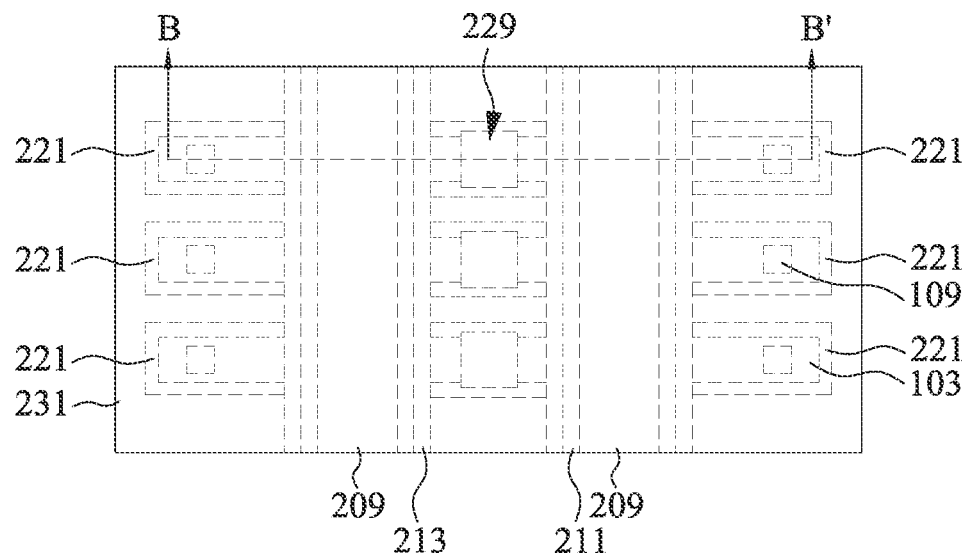
Figure 10B:
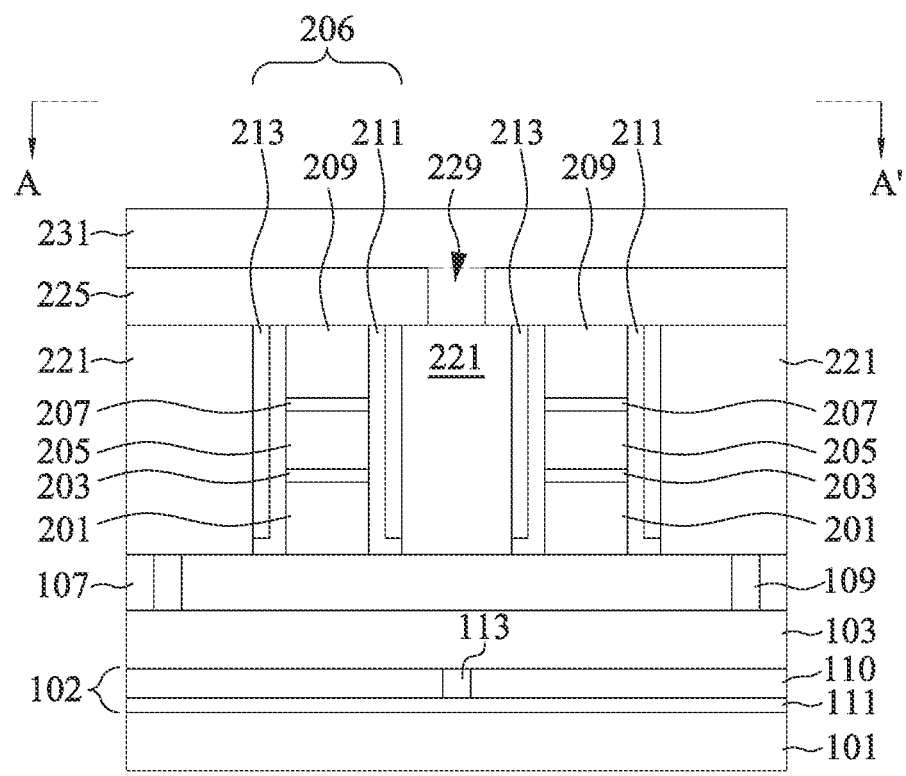

In FIGS. 10A-10B, a conductive material 231 is deposited over the third dielectric layer 225 and within the openings 227, in accordance with some embodiments. The conductive material 231 that fills the openings 227 forms second vias 229, in some embodiments. The second vias 229 may be electrically connected to some of the control word lines 221, such as those control word lines 221 that are not electrically connected to the first word lines 103, in some embodiments. The conductive material 231 may comprise one or more materials such as those described previously for the first word lines 103, and may be deposited using similar techniques. For example, the conductive material 231 may comprise tungsten deposited using CVD in some embodiments, though other materials or deposition techniques are possible. In some embodiments, a planarization process (e.g., CMP and/or grinding) may be performed on the conductive material 231 after deposition. In some embodiments, the conductive material 231 on the third dielectric layer 225 has a thickness that is in the range of about 30 nm to about 60 nm, though other thicknesses are possible.

Figure 11A:
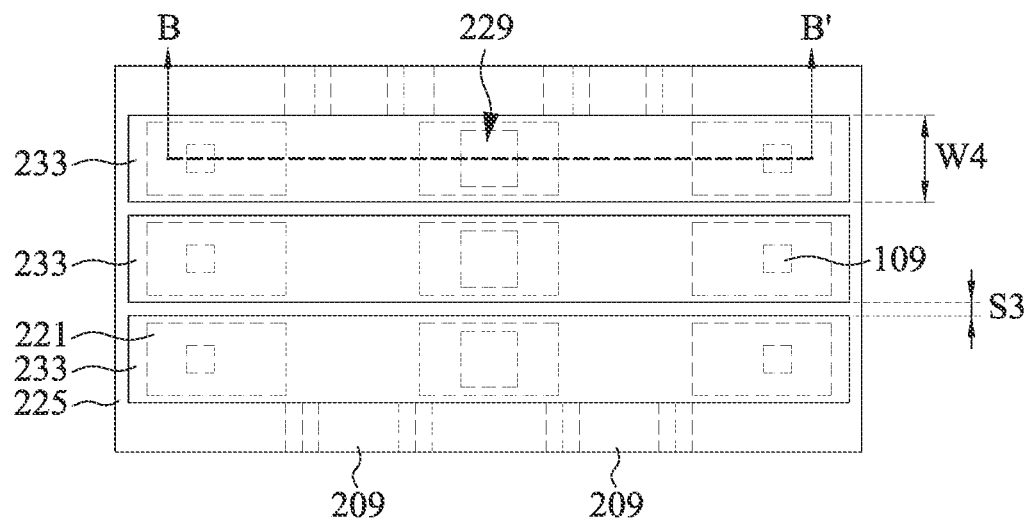
Figure 11B:
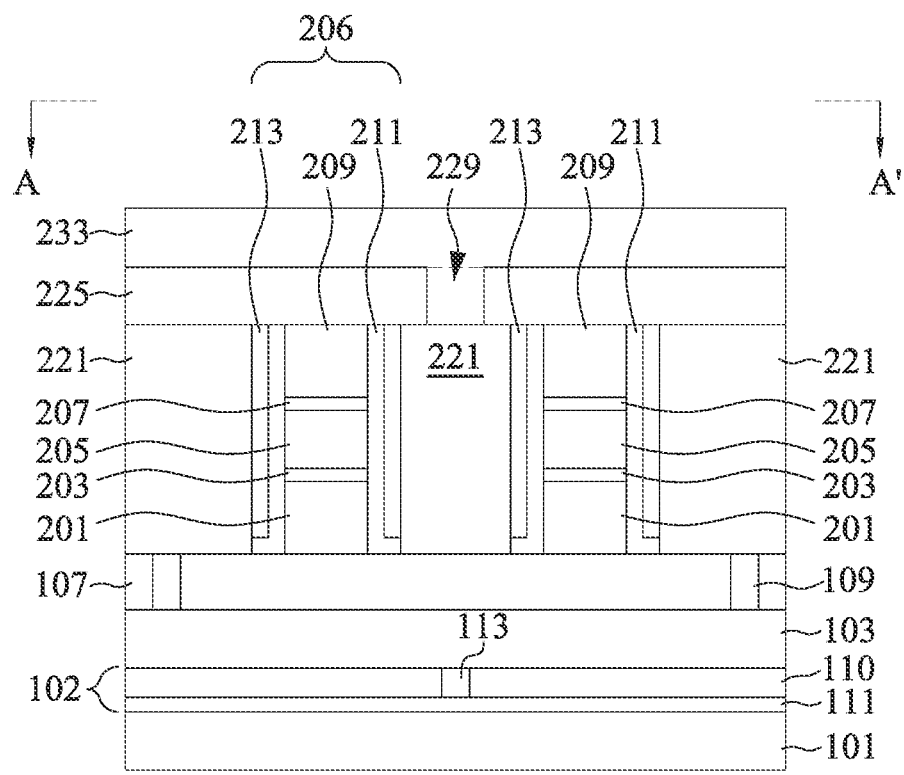
Figure 12A:
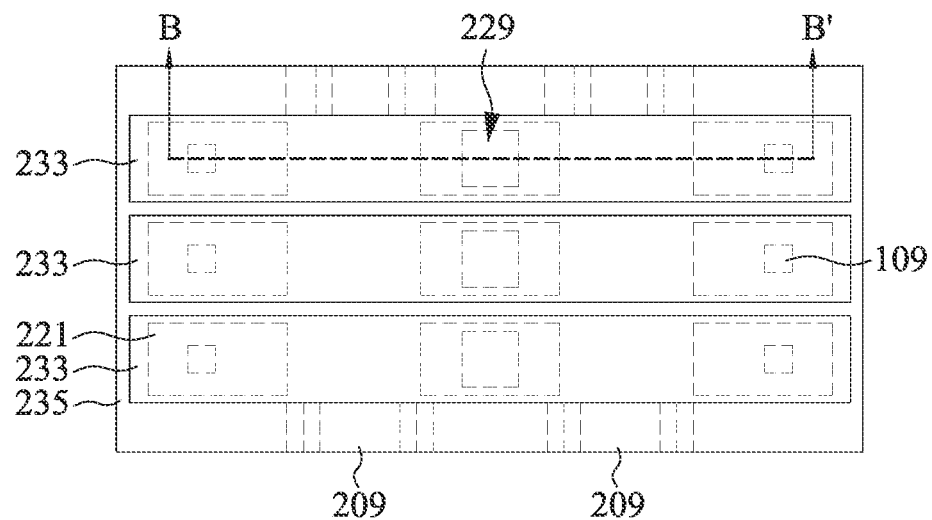
FIGS. 12A, 12B, and 12C illustrate plan views and cross-sectional views of intermediate steps in the manufacture of a memory structure, in accordance with some embodiments.

In FIGS. 11A-11B, the conductive material 231 is patterned to form second word lines 233, in accordance with some embodiments. The conductive material 231 may be patterned, for example, using suitable photolithography and etching techniques, such as those described previously. In some embodiments, the second word lines 233 may be formed over the first word lines 103 and the control word lines 221, as shown in FIG. 11A. In some embodiments, the second word lines 233 may have a width W4 that is larger than the width W1 of the first word lines 103 (see FIGS. 1A-1B) or the width W3 of the control word lines 221, but in other embodiments, the width W4 may be about the same as or smaller than the width W1 or the width W3. In some embodiments, the second word lines 233 have a width W4 that is in the range of about 40 nm to about 100 nm, though other widths are possible. In some embodiments, adjacent second word lines 233 are separated by a distance S3 that is in the range of about 40 nm to about 100 nm, though other separation distances are possible.

In some embodiments, the second word lines 233 that are formed over second vias 229 are electrically connected to corresponding control word lines 221 by the second vias 229. As shown in FIGS. 11A-11B, the second word lines 233 are electrically connected to some control word lines 221 by the second vias 229, and the first word lines 103 are electrically connected to other control word lines 221 by the first vias 109. In some embodiments, the control word lines 221 along a second word line 233 may be alternatingly connected to a corresponding first word line 103 or to that second word line 233. In this manner, one side of a memory stack 206 may be covered by a control word line 221 that is electrically connected to a first word line 103, and the other side of the memory stack 206 may be covered by a control word line 221 that is electrically connected to a second word line 233. In other embodiments, the second vias 229 may be formed using separate processing or deposition steps than the second word lines 233.

In FIGS. 12A-12D, a fourth dielectric layer 235 is deposited over the second word lines 233, forming a memory structure 250, in accordance with some embodiments. The fourth dielectric layer 235 may extend over and between the second word lines 233. In this manner, the fourth dielectric layer 235 may surround and separate the second word lines 233 to isolate the second word lines 233. The fourth dielectric layer 235 may be a material similar to the first dielectric layer 105, the second dielectric layer 107, or the third dielectric layer 225, and may be formed using similar techniques. In some embodiments, a planarization process (e.g., CMP and/or grinding) may be performed after depositing the fourth dielectric layer 235. After performing the planarization process, top surfaces of the fourth dielectric layer 235 and the second word lines 233 may be approximately level.

Figure 12B:
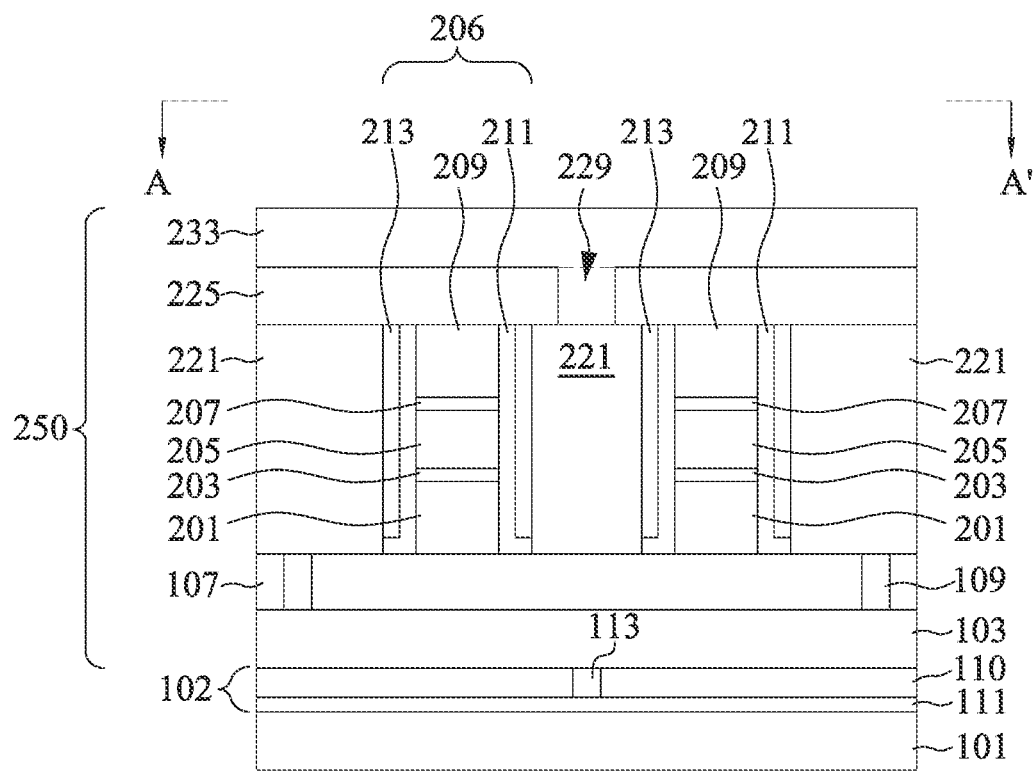
Figure 12C:
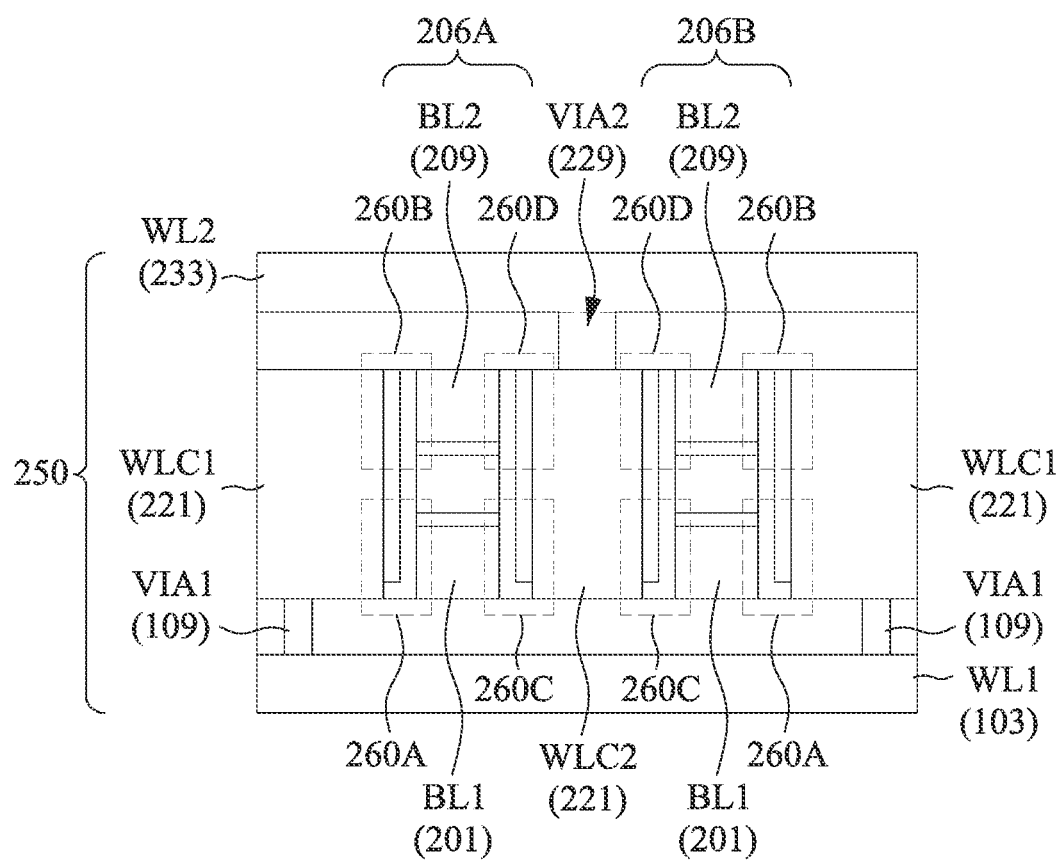

FIG. 12C illustrates a memory structure 250 similar to that shown in FIG. 12B, except various features have been labeled for explanatory purposes. For example, FIG. 12C shows a first memory stack 206A and a second memory stack 206B, each comprising a first bit line 201 (BL1) and a second bit line 209 (BL2), and each having a first control word line 221 (WLC1) on one side and a second control word line 221 (WLC2) on the other side. The first control word lines 221 (WLC1) are connected to a first word line 103 (WL1) and the second control word lines 221 (WLC2) are connected to a second word line 233 (WL2). As shown in FIG. 12C, each memory stack 206 and its adjacent control word lines 221 (WLC1, WLC2) form four memory cells 260A, 260B, 260C, and 260D. For example, the memory cells 260B and 260D are formed above the memory ells 260A and 260C, respectively. The memory cells 260A and 260B are formed on one side of a memory stack 206 and comprise different regions of the same layers of memory material 211 and selector material 213 deposited on that side, and the memory cells 260 C and 260D are formed on the other side of the memory stack 206 and comprise different regions of the same layers of memory material 211 and selector material 213 deposited on that side. Using the techniques described herein, separate memory cells 260 may be formed on both sides of a memory stack 206, which can increase the density of memory cells in a memory structure or device.

Read and write operations may be performed on each of the four memory cells 260A-D independently using the first bit line 201 (BL1), the second bit line 209 (BL2), the first control word line 221 (WLC1), and the second control word line 221 (WLC2). For example, the memory cell 260A of the first memory stack 206A may be controlled by applying voltage biases to the first word line 103 (WL1) and the first bit line 201 (BL1). The first word line 103 (WL1) is electrically connected to the first control word line 221 (WLC1) through the first via 109 (VIAL), and thus biasing the first word line 103 (WL1) allows the first control word line 221 (WLC1) to also be biased. In this manner, a corresponding voltage difference is formed across the portions of the memory material 211 and selector material 213 that are between the first bit line 201 (BL1) and the first control word line 221 (WLC1). Applying appropriate voltage biases in this manner allows the read and write operations to be performed on the memory cell 260A independently of the adjacent memory cells 260B-D, in some embodiments. Similarly, the memory cell 260B may be controlled by applying voltage biases to the second bit line 209 (BL2) and the first word line 103 (WL1), the memory cell 260C may be controlled by applying voltage biases to the first bit line 201 (BL1) and the second word line 233 (WL2), and the memory cell 260D may be controlled by applying voltage biases to the second bit line 209 (BL2) and the second word line 233 (WL2). In this manner, any memory cell 260 of a memory array 262 (see FIG. 12D) may be controlled by biasing the corresponding bit line 201/209 and corresponding word line 103/233.

As described above, in some embodiments, separate word lines (e.g., the first word lines 103 and the second word lines 233) are formed as two separate layers above and below the control word lines 221. In this manner, one word line (e.g., a first word line 103) can control memory cells 260A-B located on one side of the bit lines 201/209, and another word line (e.g., a second word line 233) can control the memory cells 260C-D located on a second side of the bit lines 201/209. As such, by putting separate word lines in different layers, the number of memory cells 260 can be doubled within the same size area without an area penalty and also without the use of dummy cells. Additionally, by forming separate bit lines 201/209, the number of memory cells 260 can be further doubled within the same size area without an area penalty. In this manner, the techniques described herein may allow for increasing the memory density of a memory structure or device up to four times, in some cases. Other configurations or densities are possible.

Figure 12D:
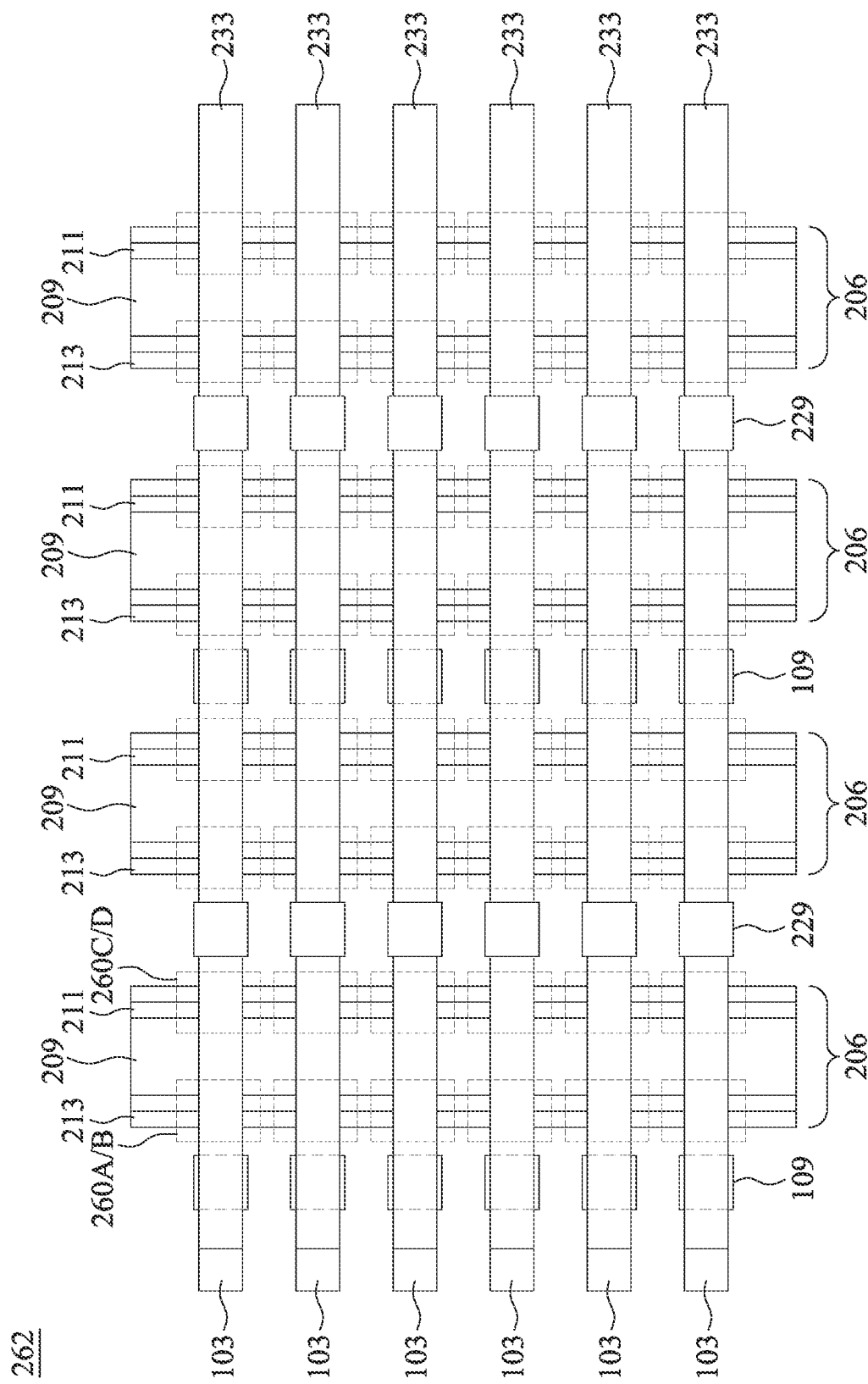
FIG. 12D illustrates a plan view of a memory array, in accordance with some embodiments.

FIG. 12D illustrates an expanded plan view of a memory array 262 comprising memory cells 260, in accordance with some embodiments. For clarity, some features are not shown in the plan view of FIG. 12D. FIG. 12D also shows an example reference cross-section C-C' that may correspond to the cross-sectional view shown in FIG. 12C. The memory array 262 comprises a plurality of memory cells 260 that may be independently controlled using corresponding bit lines 201/209 and word lines 103/233, as described previously. The memory cells 260B are above and overlap corresponding memory cells 260A, and the memory cells 260D are above and overlap corresponding memory cells 260C. As shown in FIG. 12D, the memory cells 260 may be arranged in an array of rows and columns. In some embodiments, the first word lines 103 and the second word lines 233 are parallel, and the bit lines 201/209 are perpendicular to the word lines 103/233. Additional memory structures 250 may further be stacked vertically to provide a three dimensional memory array, thereby increasing device density. In some embodiments, the memory array 262 may be disposed in the back end of line (BEOL) of a semiconductor die. For example, the memory array 262 may be disposed in the interconnect layers of the semiconductor die, such as above one or more active devices (e.g., transistors or the like) formed on a semiconductor substrate. For example, the memory array 262 may be disposed above FinFET devices, and the bit lines 201/109 may be parallel to or overlay the fins of the FinFET devices and the word lines 103/233 may be parallel to or overlay the gate structures of the FinFET devices. This is an example, and other devices, structures, arrangements, or configurations are possible. In some embodiments, the first word lines 103 or the second word lines 233 may be combined with conductive lines of logic circuits within the semiconductor die. This is further described below for FIGS. 13-14.

Figure 13:
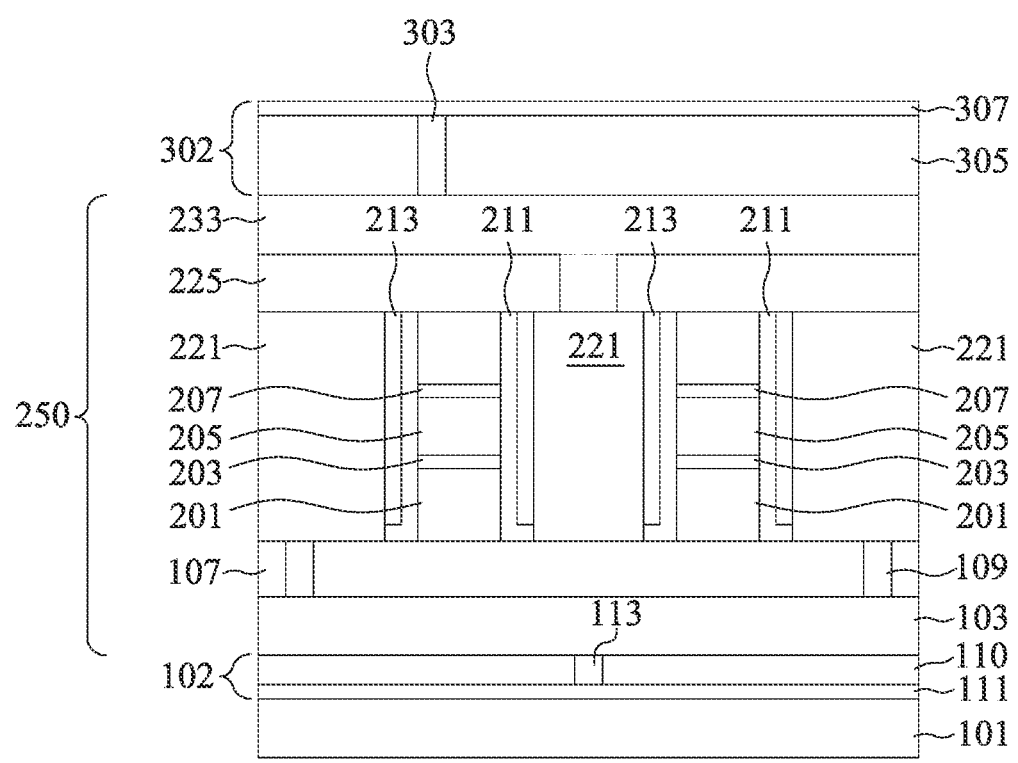
FIGS. 13 and 14 illustrate cross-sectional views of intermediate steps in the manufacture of a memory device, in accordance with some embodiments.

FIG. 13 illustrates a cross-sectional view of the structure shown in FIG. 12B after further processing, in accordance with some embodiments. In particular, FIG. 13 illustrates the formation of second metallization layers 302 over the memory structure 250, in accordance with some embodiments. The second metallization layers 302 may be formed over the second word lines 233 in order to electrically connect the second word lines 233 to other functional circuitry. In some embodiments, the second metallization layers 302 may be connected to the first word lines 103 or the first metallization layers 102 by through-vias (not shown in the figures). The second metallization layers 302 may be formed, for example, in a similar manner and with similar materials as the first metallization layers 102 (see FIGS. 1A-1B), though other techniques or materials are possible.

As a representative example, the second metallization layers 302 are shown in FIG. 13 as including a dielectric layer 305 overlying the second word line 233, a conductive line 307 overlying the dielectric layer 305, and a conductive via 303 extending through the dielectric layer 305 to electrically connect the second word line 233. In some embodiments, the conductive line 307 may be part of a logic circuit or another type of circuit, and the second metallization layers 302 may have any suitable number of conductive layers, dielectric layers, or conductive vias.

Figure 14:
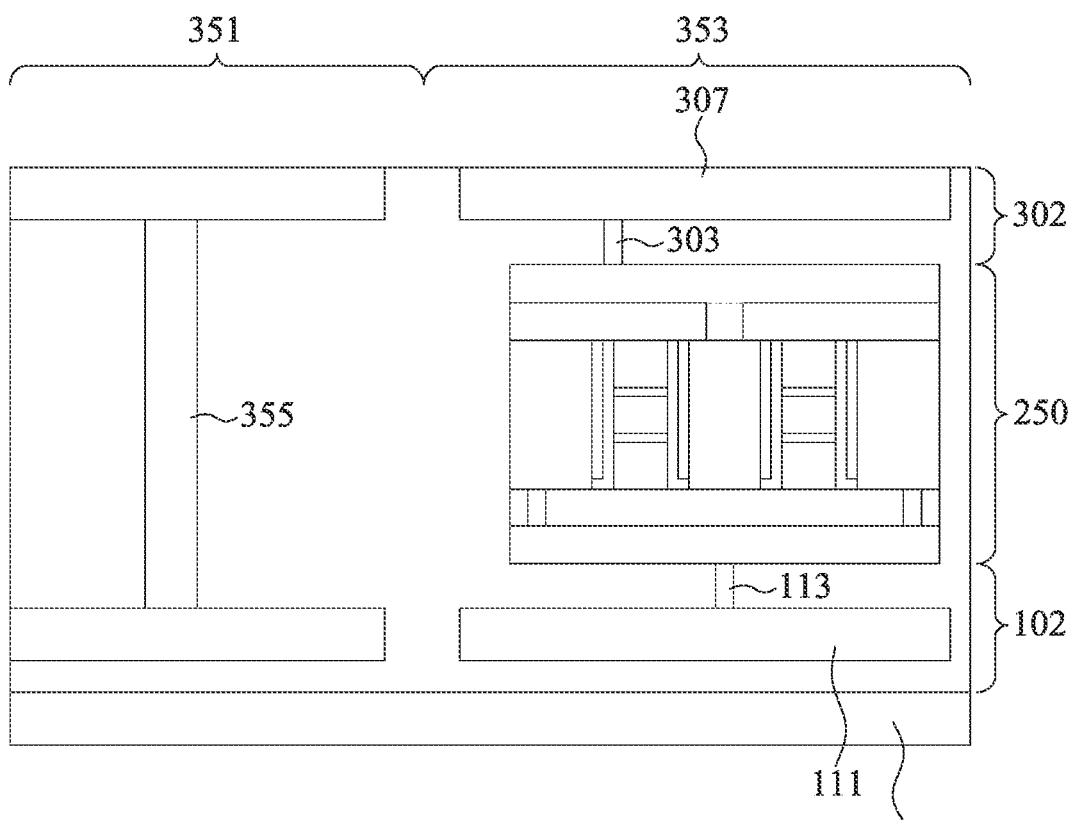

FIG. 14 illustrates a cross-sectional view of a semiconductor device 350 comprising a memory structure 250, in accordance with some embodiments. The memory structure 250 may be similar to the memory structure 250 or memory array 262 described previously for FIGS. 12A-12D. In some embodiments, the semiconductor device 350 comprises first metallization layers 102 and second metallization layers 302 formed over a substrate 101. The first metallization layers 102, the second metallization layers 302, and the substrate 101 of the semiconductor device 350 may be similar to those described previously for FIGS. 1A-1B and FIG. 13, and may be formed using similar techniques or materials. In some embodiments, the semiconductor device 350 has a logic region 351 and a memory region 353 over the substrate 101. In some embodiments, the memory structure 250 may be formed between the first metallization layers 102 and the second metallization layers 302 of the semiconductor device 350. For example, the memory structure 250 may be formed between the conductive line 111 and the conductive line 307, in some embodiments.

In some cases, the logic region 351 of the semiconductor device 350 comprises active devices, passive devices, logic devices, or the like. In some embodiments, the memory structure 250 may be formed in the memory region 353 but not formed in the logic region 351. Accordingly, the regions of the logic region 351 that are at or near the same level as the memory structure 250 may be filled with one or more dielectric materials, which may comprise one or more of the previously described dielectric layers, such as the dielectric layer 110, the first dielectric layer 105, the second dielectric layer 107, the third dielectric layer 225, the dielectric layer 305, or the like. For clarity, these and other various dielectric layers are not separately illustrated.

FIG. 14 additionally illustrates the formation of a conductive via 355 extending through the one or more dielectric materials to connect a conductive line 111 and a conductive line 307 within the logic region 351. The conductive via 355 may be formed, for example, using techniques or materials similar to those used for the conductive via 303, though other techniques or materials are possible. In some embodiments, the conductive via 355 may be formed using one or more of the same process steps that form the conductive via 303, but in other embodiments the conductive via 355 may be formed before or after the conductive via 303. By incorporating the memory structure 250 into the metallization layers of the semiconductor device 350 as described herein, the semiconductor device 350 may have greater flexibility of design and improved memory density. For example, in some cases, the multiple overlapping word lines 103/233 and overlapping bit lines 201/209 of the memory structure 250 may be connected to different metal layers of the logic region 351.

FIGS. 15A-17B illustrate intermediate steps in the formation of a memory structure 252 (see FIG. 17B), in accordance with some embodiments. The memory structure 252 is similar to the memory structure 250 shown in FIGS. 12A-12C, except that the memory structure 252 includes portions of the hard mask 210 over the bit line stacks 204. By leaving portions of the hard mask 210 on the bit line stacks 204, the risk of leakage between the second vias 229 and the second bit lines 209 may be reduced or eliminated. In this manner, the inclusion of the hard masks 210 as shown in FIGS. 15A-17B can increase the yield window during processing, in some cases. The techniques described in FIGS. 15A-17B may be applied to other embodiments of the present disclosure.

Figure 15A:
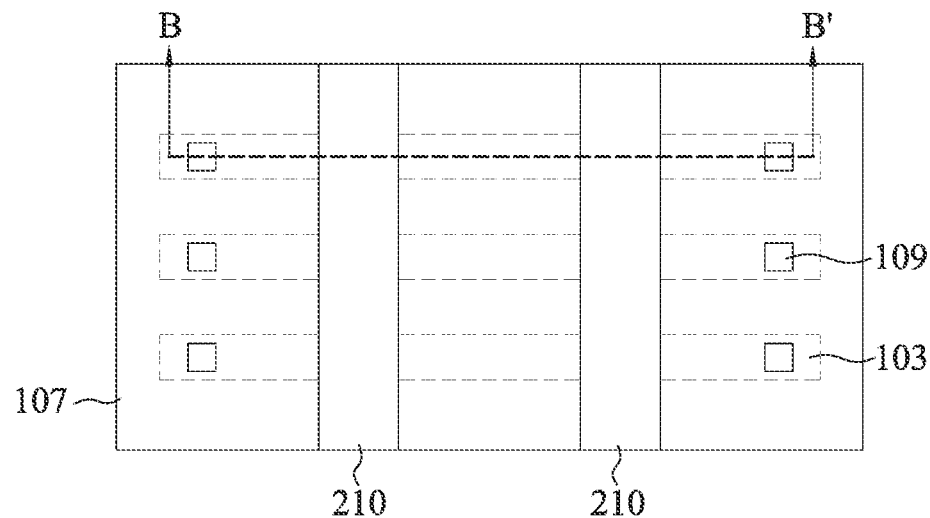
FIGS. 15A, 15B, 16A, 16B, 17A, and 17B illustrate plan views and cross-sectional views of intermediate steps in the manufacture of a memory structure, in accordance with some embodiments.
Figure 15B:
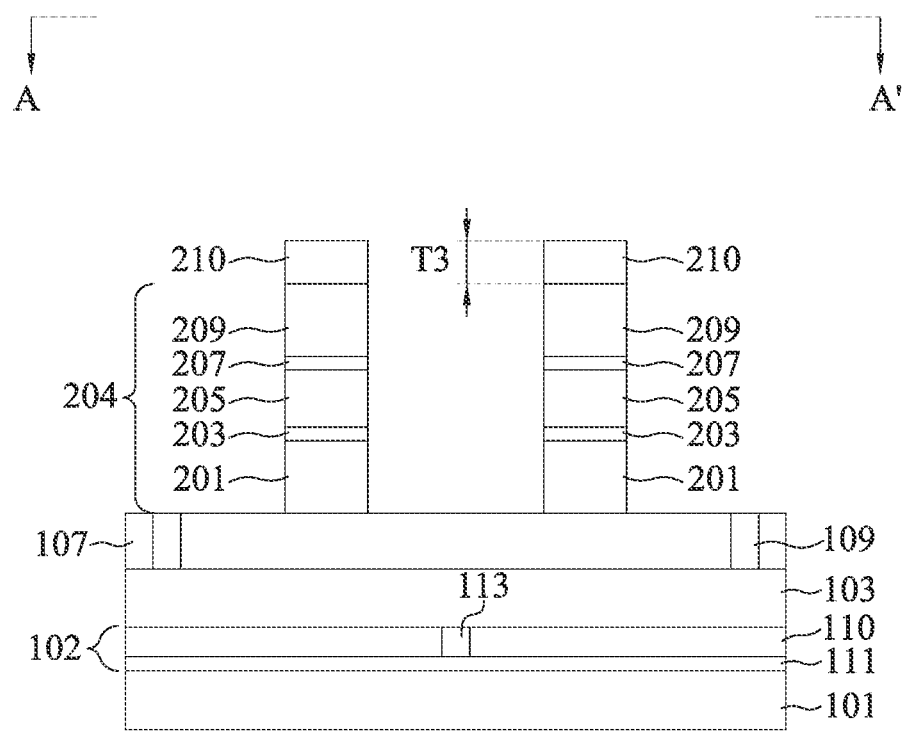

FIGS. 15A-15B illustrate the formation of bit line stacks 204, in accordance with some embodiments. The bit line stacks 204 are similar to those shown in FIGS. 3A-3B and may be formed in a similar manner, except that the patterned hard mask 210 used as an etching mask is left remaining on the bit line stacks 204 after etching the bit line layers 202. In some embodiments, the portions of the hard mask 210 remaining on the bit line stacks 204 have a thickness T3 that is in the range of about 10 nm to about 30 nm, though other thicknesses are possible.

Figure 16A:
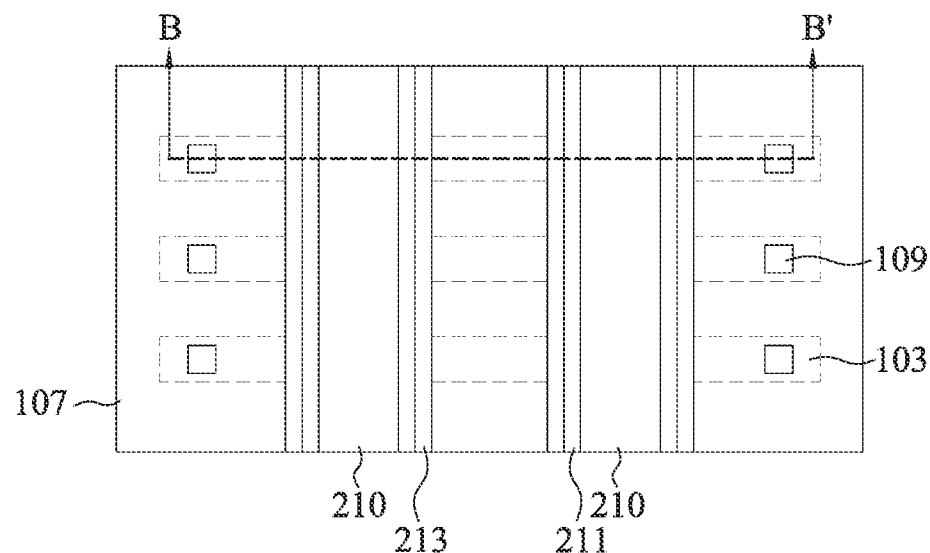
Figure 16B:
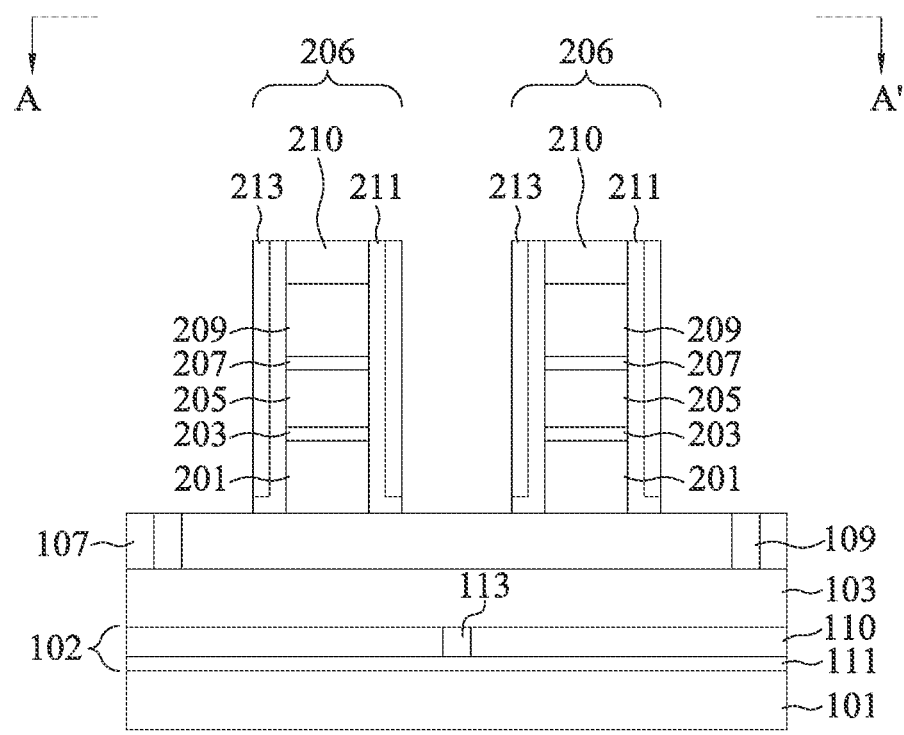

In FIGS. 16A-16B, the memory material 211 and the selector material 213 are formed, in accordance with some embodiments. The memory material 211 and the selector material 213 may be similar to those shown in FIGS. 4A-5B, and may be formed in a similar manner, except that the memory material 211 and the selector material 213 are deposited on the sidewalls of the hard mask 210 in addition to the sidewalls of the bit line stacks 204. As shown in FIG.

16B, the memory material 211 and the selector material 213 may be removed from horizontal surfaces using techniques similar to those described previously for FIGS. 5A-5B. In this manner, memory stacks 206 are formed that include the hard mask 210.

Figure 17A:
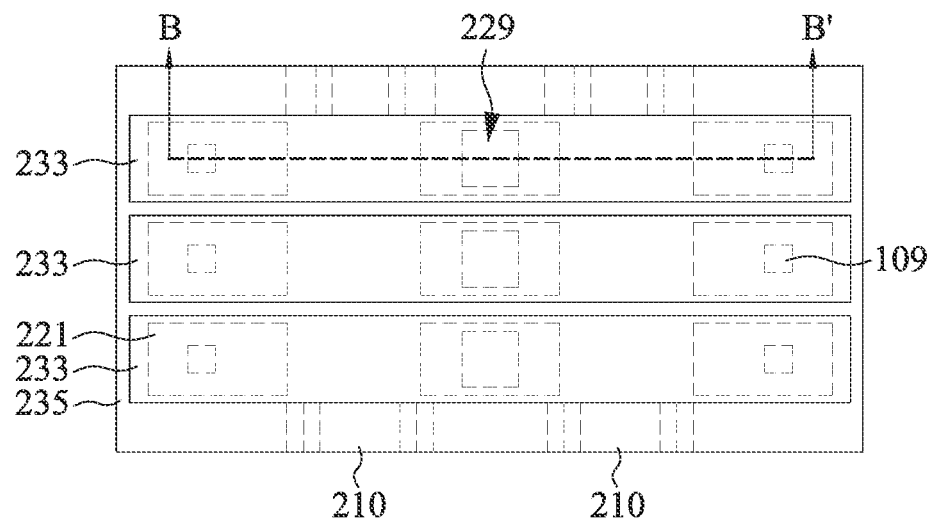
Figure 17B:
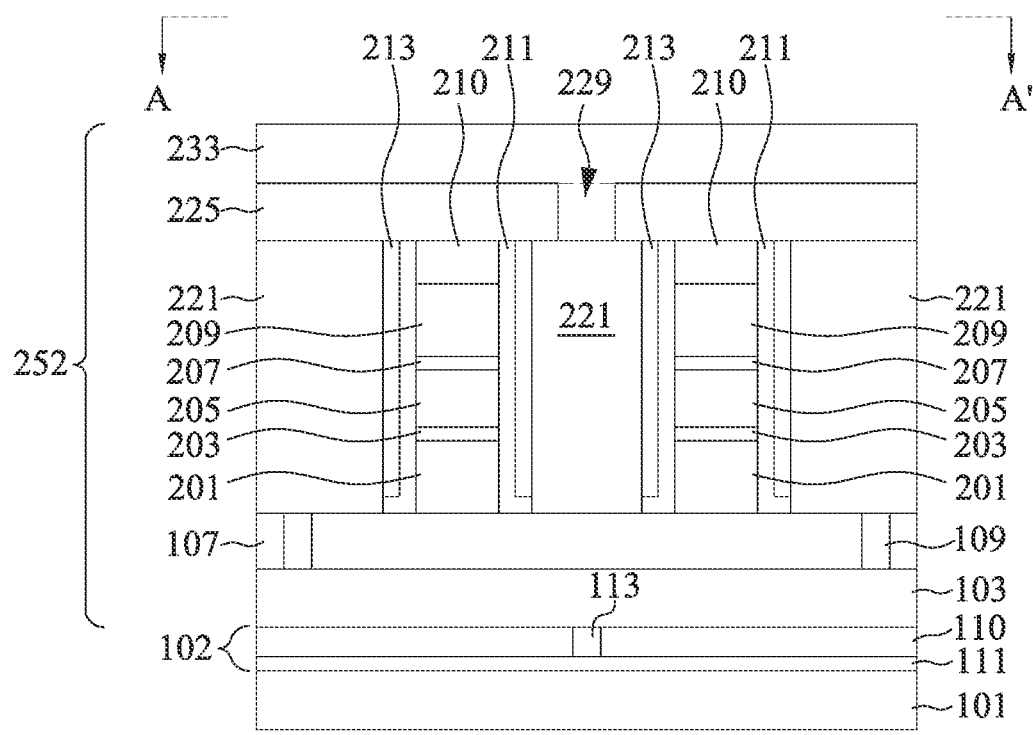

FIGS. 17A-17B illustrate the formation of a memory structure 252 including the hard mask 210, in accordance with some embodiments. After forming the memory stacks 206 shown in FIGS. 16A-16B, processing steps similar to those described for FIGS. 6A-12B may be performed to form the memory structures 252. In some embodiments, the memory stacks 206 of the memory structure 252 may have a thickness that is in the range of about 110 nm to about 230 nm, though other thicknesses are possible. As described above, the presence of the hard mask 210 can improve the electrical isolation between the second vias 229 and the second bit lines 209 of the memory structure 252. In some embodiments, additional processing steps may be performed, such as those described previously for FIGS. 13-14.

FIGS. 18A-22B illustrate intermediate steps in the formation of a memory structure 254 (see FIG. 22B), in accordance with some embodiments. The memory structure 254 is similar to the memory structure 250 shown in FIGS. 12A-12C, except that the memory material 211 and the selector material 213 of the memory structure 254 are deposited and etched sequentially. In this manner, the memory material 211 may be formed having a substantially constant thickness on the sidewalls of the bit line stacks 204, and thus may not have the "L-shaped" profile as shown previously, for example, in FIG. 5B. Additionally, the techniques described herein allow the selector material 213 to be formed extending approximately the full height of the sidewalls of the bit line stacks 204, in some embodiments. By forming the memory material 211 and the selector material 213 separately as described herein, improved control of the removal of horizontal portions of the memory material 211 or selector material 213 may be achieved. The techniques described in FIGS. 18A-22B may be applied to other embodiments of the present disclosure.

Figure 18A:
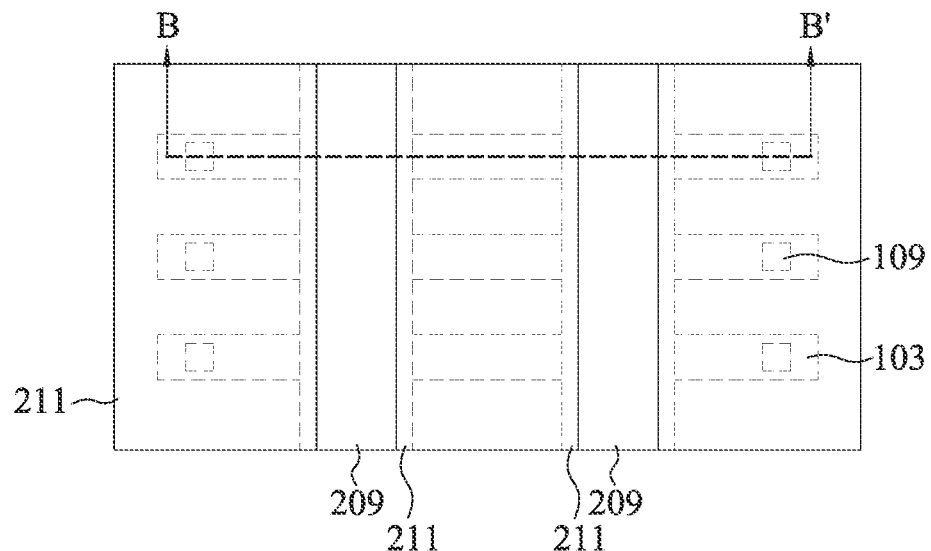
FIGS. 18A, 18B, 19A, 19B, 20A, 20B, 21A, 21B, 22A, and 22B illustrate plan views and cross-sectional views of intermediate steps in the manufacture of a memory structure, in accordance with some embodiments.
Figure 18B:
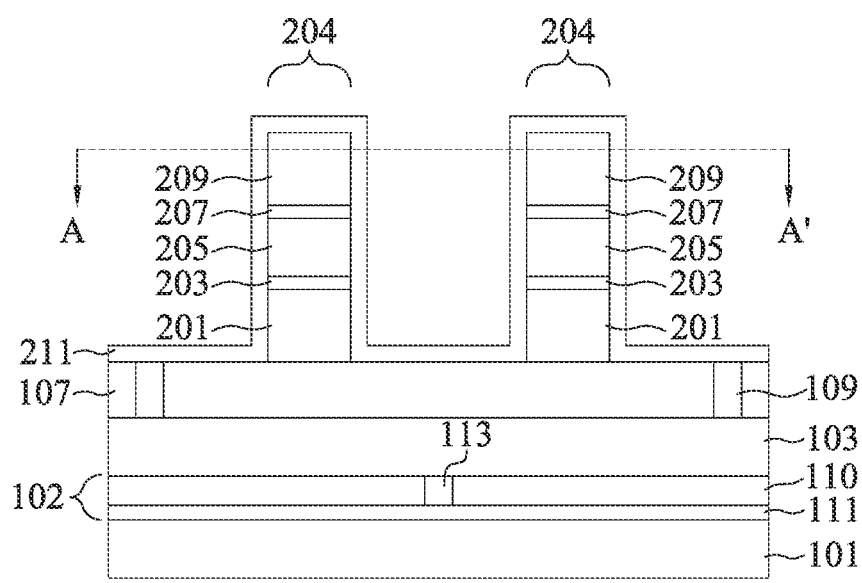
Figure 19A:
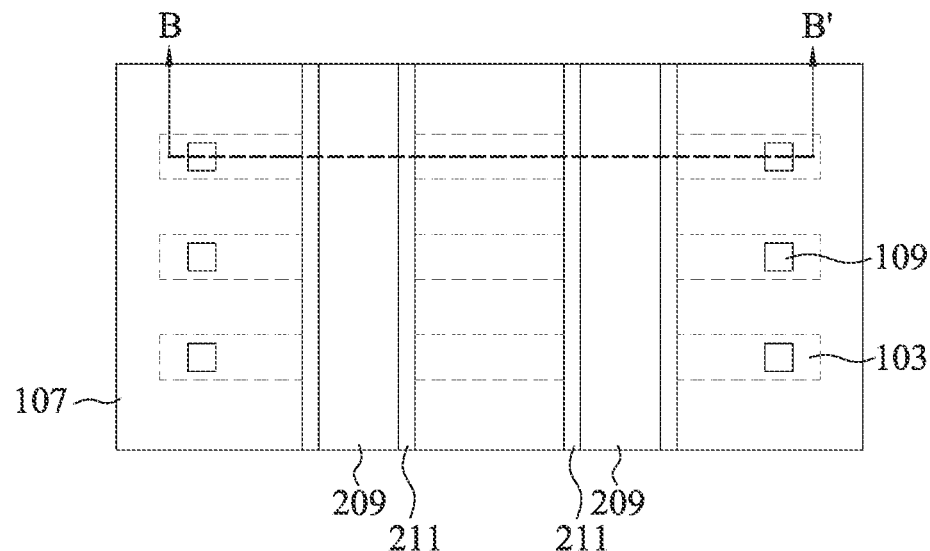
Figure 19B:
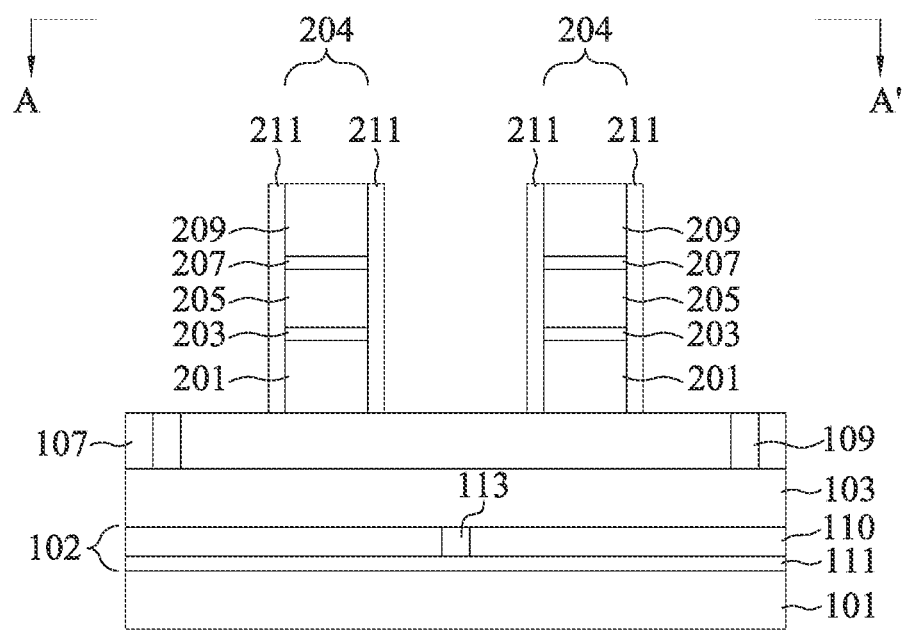

FIGS. 18A-18B illustrate the deposition of the memory material 211, in accordance with some embodiments. The memory material 211 may be formed, for example, as a blanket layer covering the structure shown in FIGS. 3A-3B. The memory material 211 may be similar to that described for FIGS. 4A-4B, and may be formed in a similar manner. In FIGS. 19A-19B, an etching process is performed to remove portions of the memory material 211 from horizontal surfaces, in accordance with some embodiments. The etching process may be similar to one or more etching processes described for FIGS. 5A-5B. For example, the etching process may leave portions of the memory material 211 remaining on sidewalls of the bit line stacks 204, in accordance with some embodiments.

Figure 20A:
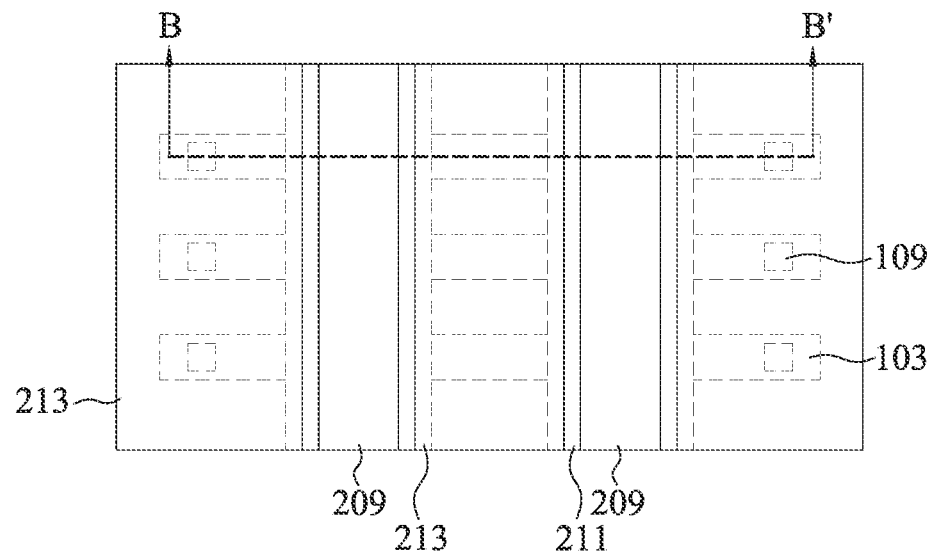
Figure 20B:
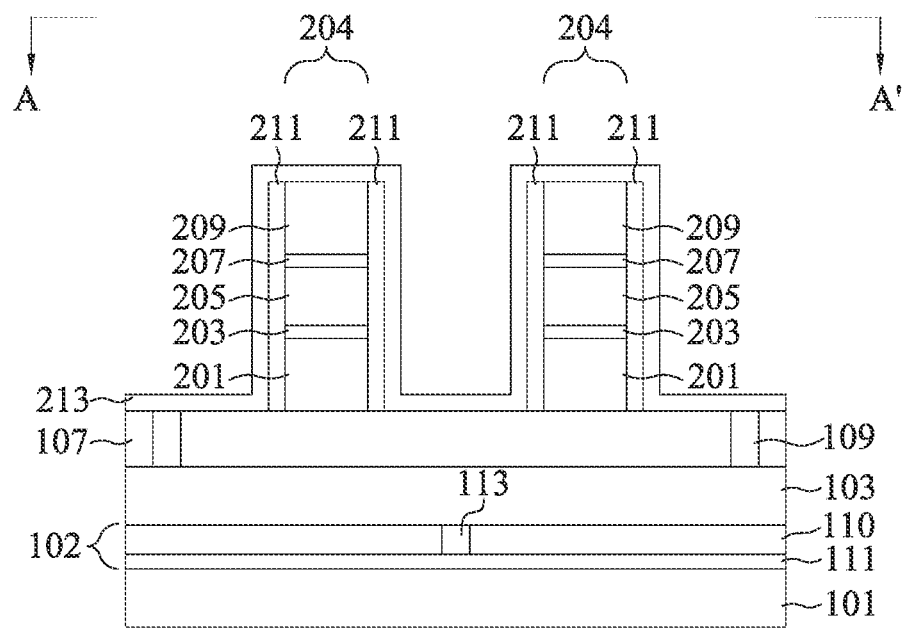
Figure 21A:
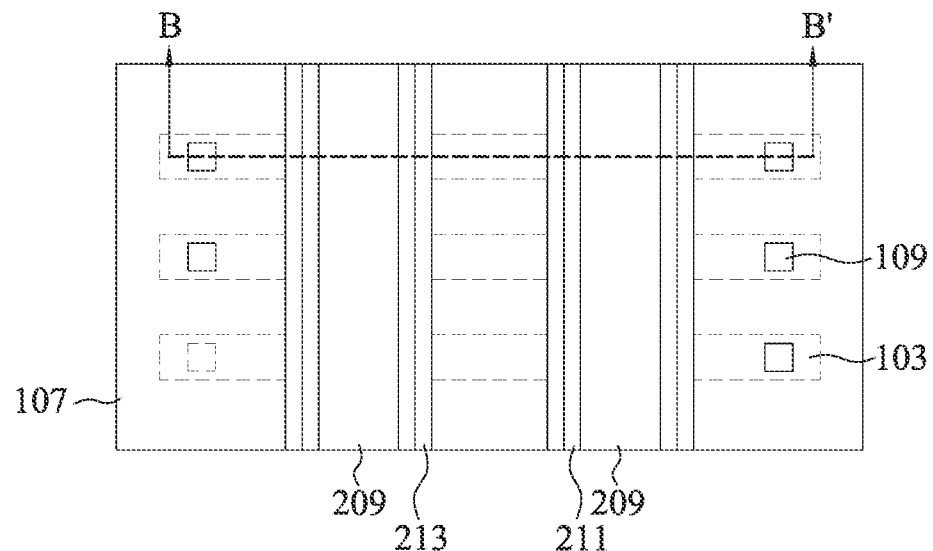
Figure 21B:
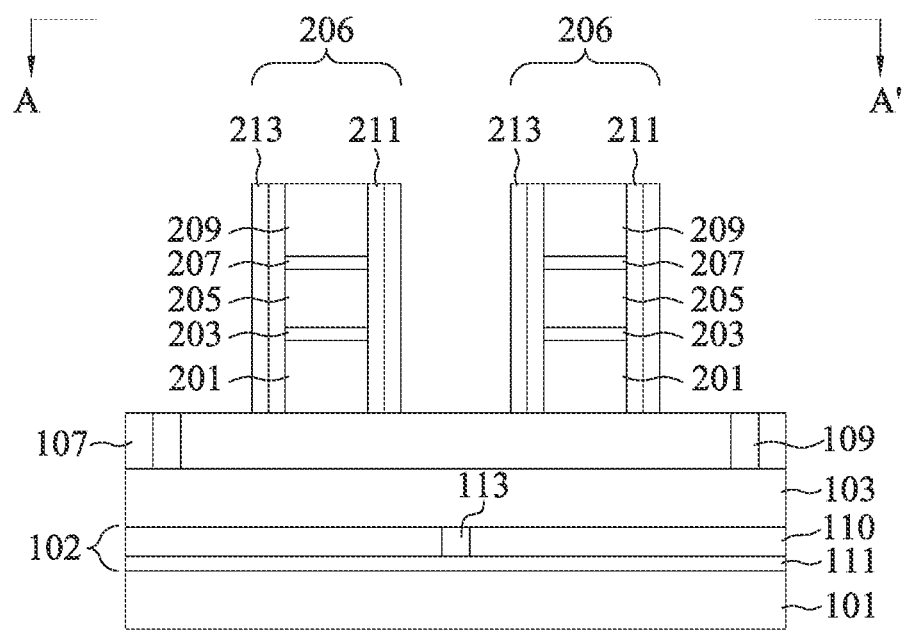

FIGS. 20A-20B illustrate the deposition of the selector material 213, in accordance with some embodiments. The selector material 213 may be formed, for example, as a blanket layer covering the structure shown in FIGS. 19A-19B. The selector material 213 may be similar to that described for FIGS. 4A-4B, and may be formed in a similar manner. In FIGS. 21A-21B, an etching process is performed to remove portions of the selector material 213 from horizontal surfaces, forming memory stacks 206, in accordance with some embodiments. The etching process may be similar to one or more etching processes described for FIGS. 5A-5B. For example, the etching process may leave portions of the selector material 213 remaining on sidewalls of the bit line stacks 204 (e.g., on the memory material 211), in accordance with some embodiments.

Figure 22A:
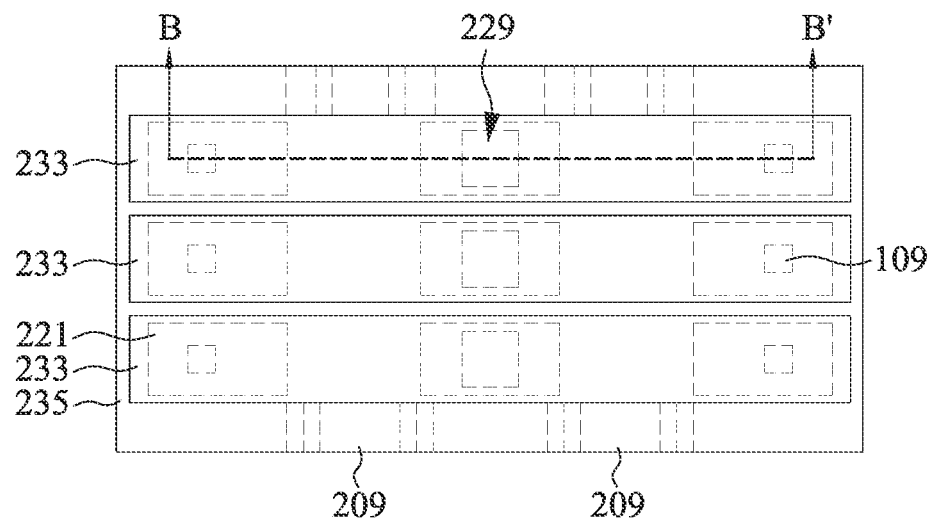
Figure 22B:
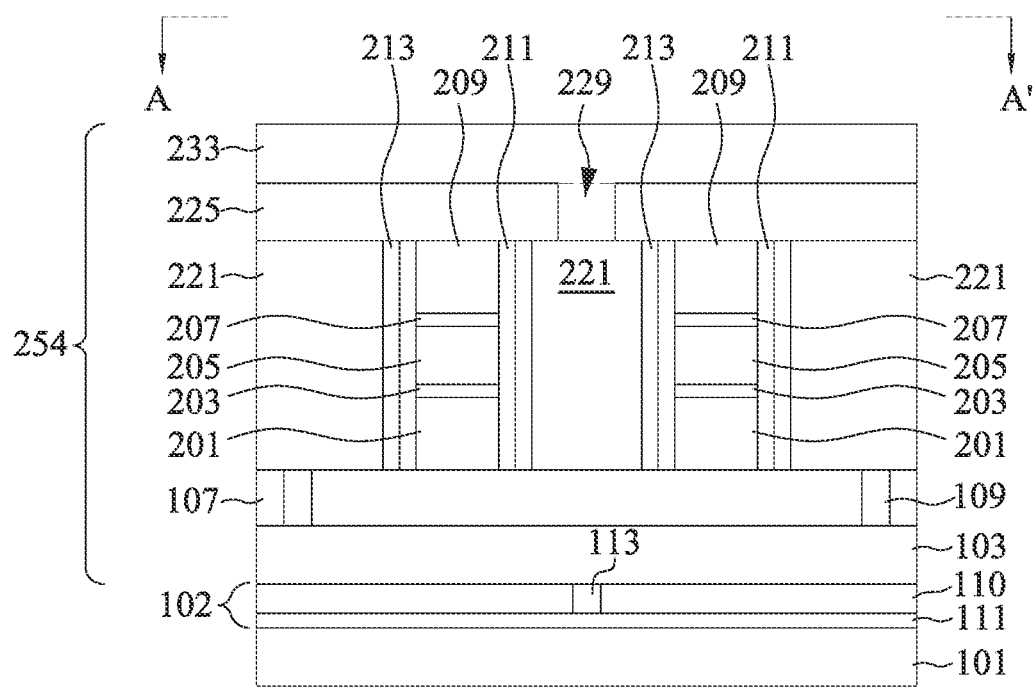

FIGS. 22A-22B illustrate the formation of a memory structure 254, in accordance with some embodiments. After forming the memory stacks 206 shown in FIGS. 21A-21B, processing steps similar to those described for FIGS. 6A-12B may be performed to form the memory structures 254. In some embodiments, additional processing steps may be performed, such as those described previously for FIGS. 13-14.

FIGS. 23A-32B illustrate intermediate steps in the formation of a memory structure 450 (see FIG. 32A-B), in accordance with some embodiments. The memory structure 450 is similar to the memory structure 250 described for FIGS. 12A-12D, except that the memory structure 450 comprises bit line stacks 404 having electrodes 402/408 that protrude from the sidewalls of bit line stacks 404. The electrodes 402/408 may allow for improved device performance, efficiency, and reproducibility, described in greater detail below. In some cases, the first electrode 402 may be considered part of the first bit line 201 and the second electrode 408 may be considered part of the second bit line 209.

Figure 23A:
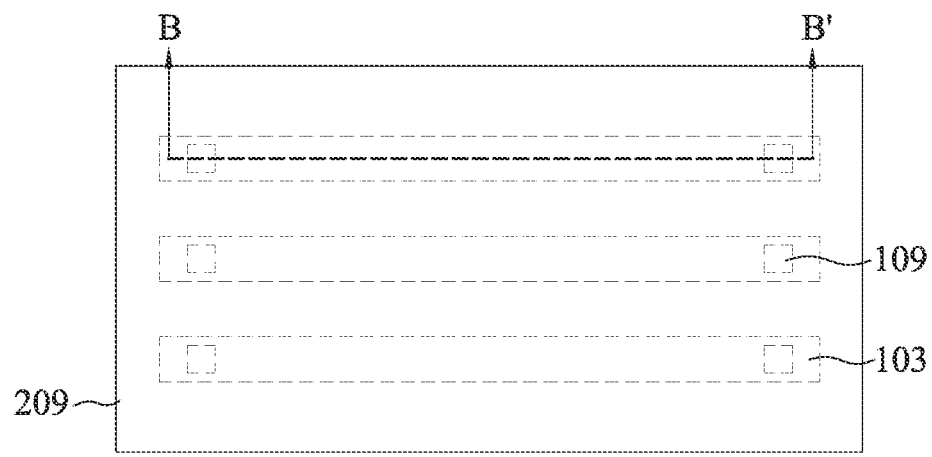
FIGS. 23A, 23B, 24A, 24B, 25A, 25B, 26A, and 26B illustrate plan views and cross-sectional views of intermediate steps in the manufacture of bit line stacks of a memory structure with electrodes, in accordance with some embodiments.
Figure 23B:
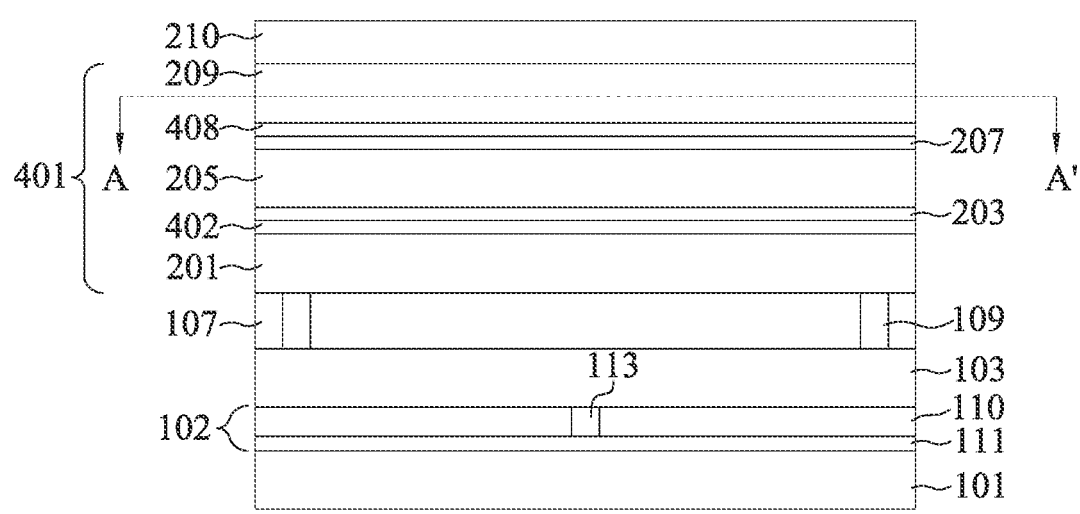

FIGS. 23A-23B illustrate the deposition of bit line layers 401, in accordance with some embodiments. The bit line layers 401 are subsequently patterned to form the first bit lines 201 and the second bit lines 209 (see FIGS. 24A-24B) of the memory structure 450 and the first electrodes 402 and the second electrodes 408 (see FIGS. 26A-26B) of the memory structure 450, in accordance with some embodiments. In some embodiments, the bit line layers 401 may include first bit line material 201, first electrode material 402, first adhesion layer 203, insulating layer 205, second adhesion layer 207, second electrode material 408, and second bit line material 209. In some embodiments, the first bit line material 201, the first adhesion layer 203, the insulating layer 205, the second adhesion layer 207, and the second bit line material 209 are materials similar to those described previously for FIGS. 2A-2B, and may be deposited using similar techniques. These various material layers may have similar thicknesses as described previously for FIGS. 2A-2B, or may have different thicknesses than described previously. In some embodiments, a hard mask (not shown in FIGS. 23A-23B) may be deposited over the bit line layers 401 for use during subsequent patterning steps. The hard mask may be similar to the hard mask 210 described for FIGS. 2A-2B.

In some embodiments, the first electrode material 402 is between the first bit line material 201 and the first adhesion layer 203, and the second electrode material 408 is between the second adhesion layer 207 and the second bit line material 209. The electrode material 402/408 comprises a conductive material that may be different from the bit line material 201/209. For example, in some embodiments, the electrode material 402/408 comprises a material such as ruthenium, tungsten, copper, titanium, titanium nitride, tantalum, tantalum nitride, combinations thereof, or the like. The electrode material 402/408 may be deposited using suitable techniques, such as plating, CVD, PVD, PECVD, ALD, or the like. In some embodiments, the first electrode material 402 and the second electrode material 408 may each have a thickness in the range of about 2 nm to about 5 nm, though other thicknesses are possible.

In some embodiments, the electrode material 402/408 is a material that has a lower etch rate than the bit line material 201/209 for some etching processes. In other words, the materials of the bit line material 201/209 and the electrode material 402/408 may be chosen such that a selective etching process may selectively etch the bit line material 201/209 over the electrode material 402/408. In some embodiments, the selective etching process may selectively etch the material of the adhesion layers 203/207 over the electrode material 402/408. For example, in some embodiments, the bit line material 201/209 may be tungsten and the electrode material 402/408 may be ruthenium, though other materials are possible.

Figure 24A:
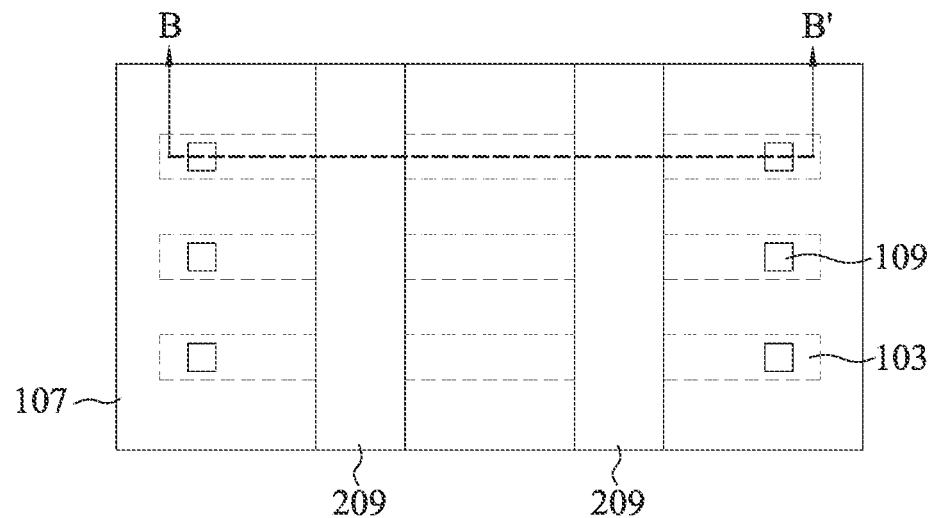
Figure 24B:
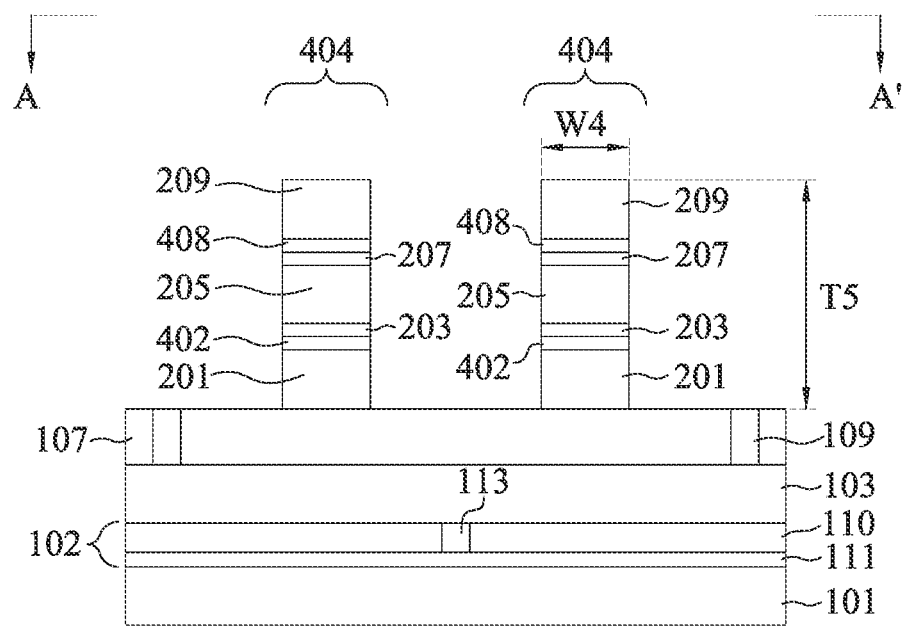

FIGS. 24A-24B illustrate a patterning of the bit line layers 401 to form bit line stacks 404, in accordance with some embodiments. The bit line stacks 404 may be patterned from the bit line layers 401 using suitable photolithographic masking and etching processes, such as those described previously for patterning the bit line stacks 204 (see FIGS. 3A-3B). For example, a hard mask over the bit line layers 401 may be patterned, and then pattern of the hard mask may be transferred to the bit line layers 401 using one or more acceptable etching processes. In this manner, the pattern of the hard mask is extended through the bit line layers 401, patterning the first bit line material 201 to define the first bit lines 201 and patterning the second bit line material 209 to define the second bit lines 209. In some embodiments, one or more layers of the bit line layers 401 may be etched using a different etching process than one or more other layers of the bit line layers 401. The hard mask may be removed during or after the formation of the bit line stacks 404, in some embodiments. In some embodiments, the bit line stacks 204 have a thickness T5 that is in the range of about 100 nm to about 200 nm, though other thicknesses are possible. In some embodiments, the bit line stacks 404 have a width W4 that is in the range of about 40 nm to about 100 nm, though other widths are possible.

Figure 25A:
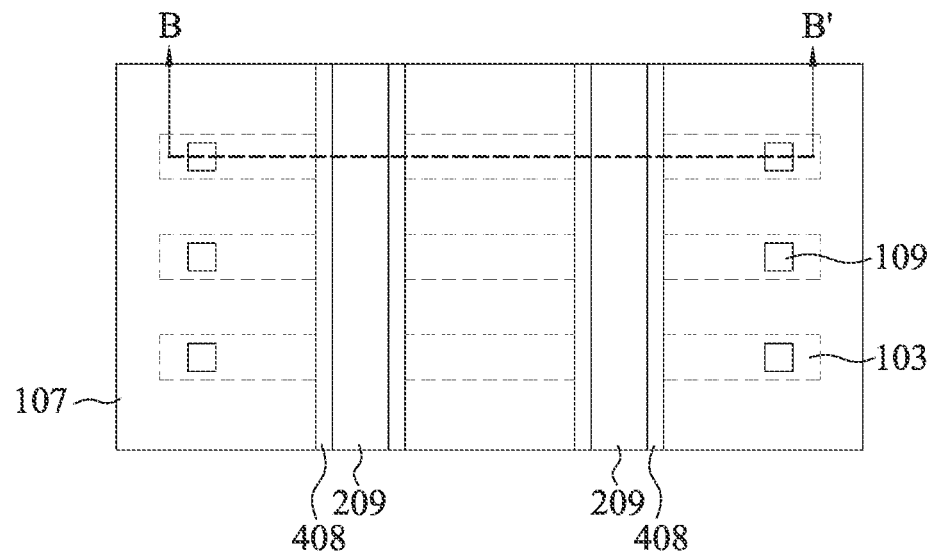
Figure 25B:
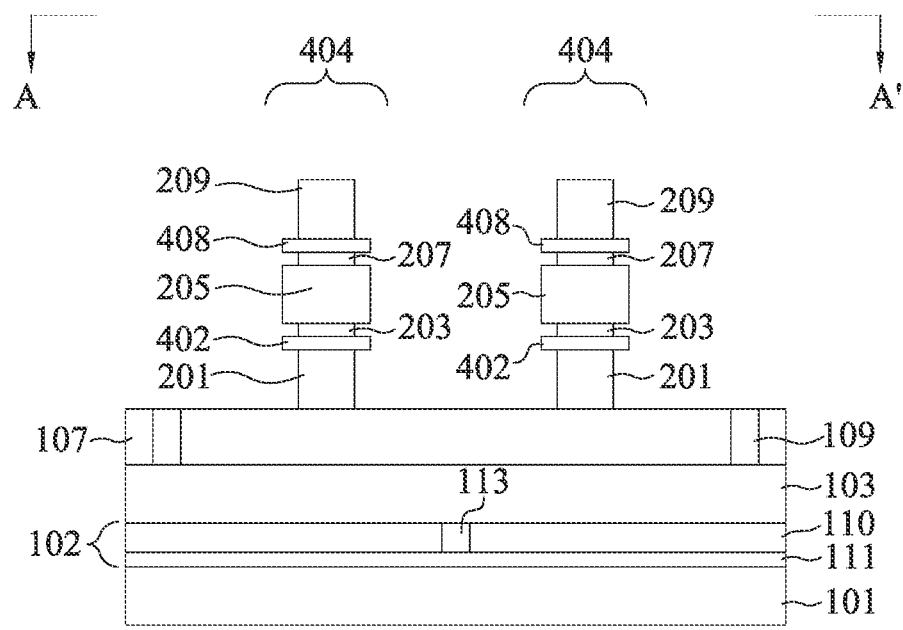

In FIGS. 25A-25B, a first selective etching process is performed on the bit line stacks 404 to form the first electrodes 402 and the second electrodes 408, in accordance with some embodiments. The first selective etching process selectively etches surfaces of the first bit line 201, the second bit line 209, the first adhesion layer 203, and the second adhesive layer 207 over surfaces of the first electrode material 402 and the second electrode material 408, in some embodiments. For example, during the first selective etching process, a first etch rate of the bit line material 201/209 may be greater than a second etch rate of the electrode material 402/408. In some embodiments, the ratio of this first etch rate to this second etch rate is in the range of about 10:1 to about 100:1, though other ratios are possible. In this manner, the first selective etching process recesses sidewalls of the bit lines 201/209 and the adhesive layers 203/207, and leaves portions of the first electrode material 402 and the second electrode material 408 protruding from the sidewalls of the bit line stacks 404. After performing the first selective etching process, the remaining portions of the first electrode material 402 form the first electrodes 402, and the remaining portions of the second electrode material 408 form the second electrodes 408.

Figure 33A:
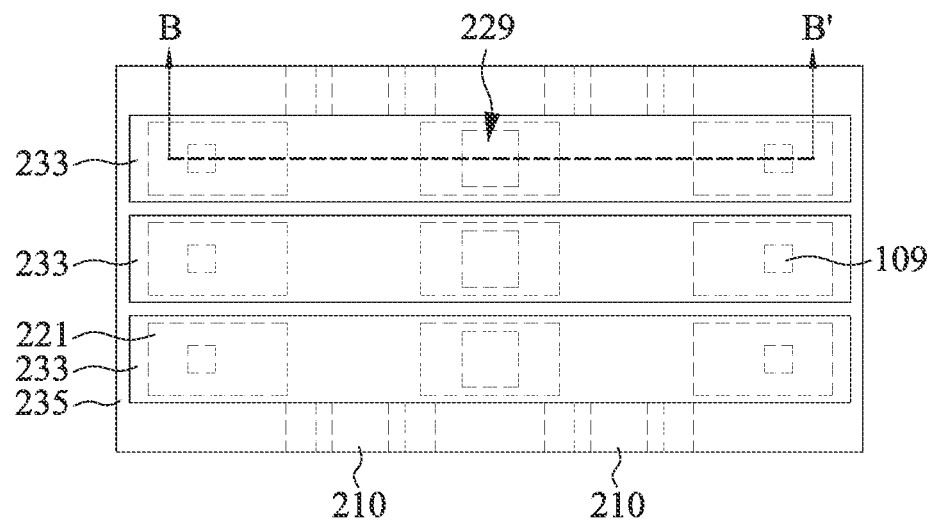
FIGS. 33A and 33B illustrate a plan view and a cross-sectional view of an intermediate step in the manufacture of a memory structure with electrodes, in accordance with some embodiments.
Figure 33B:
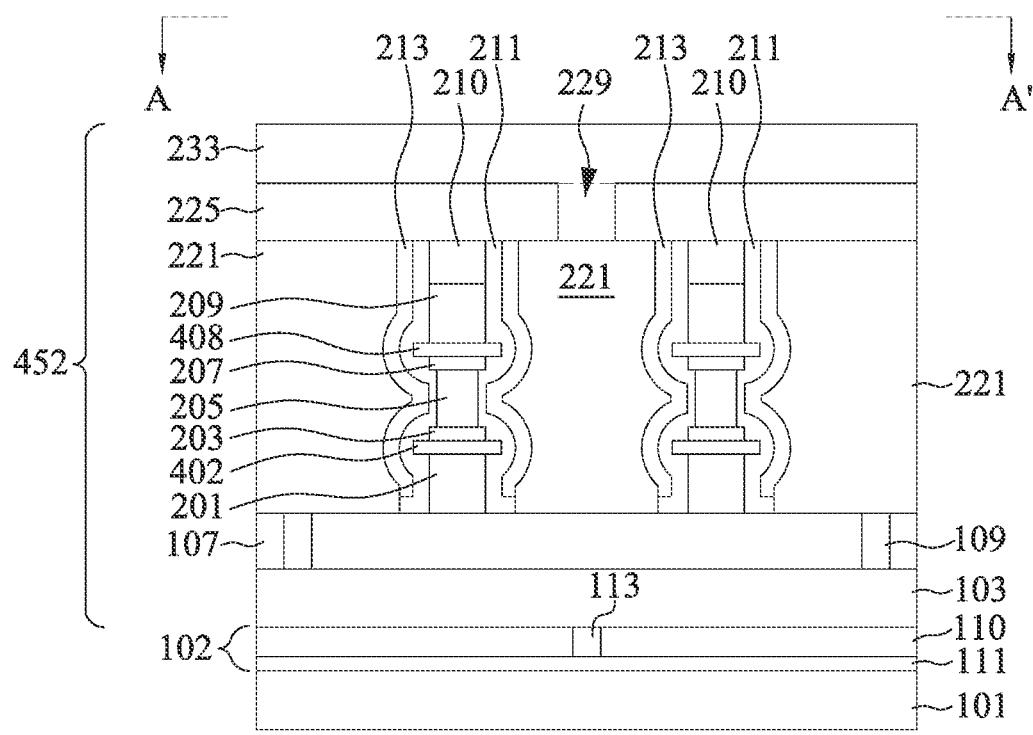

In some cases, the first selective etching process may recess the bit lines 201/209 a different amount than the adhesive layers 203/207. In some cases, the first selective etching process may recess the first bit lines 201 a different amount than the second bit lines 209. In some cases, top surfaces of the second bit lines 209 are etched by the first selective etching process. In some embodiments, the hard mask is left on the second bit lines 209 to protect top surfaces of the second bit lines 209 during the first selective etching process. The hard mask may be removed after performing the first selective etching process, in some embodiments. In other embodiments, the hard mask is not removed, and an example embodiment of this is shown in FIGS. 33A-B.

The first selective etching process may include one or more wet and/or dry etching processes. For example, the first selective etching process may be a plasma etching process comprising chlorine as a process gas, though other process gases or mixtures of process gas possible. In some embodiments, the first selective etching process may have a process pressure in the range of about 1 mTorr to about 10 mTorr, though other pressures are possible. In some embodiments, the first selective etching process may use a plasma power in the range of about 40 W to about 800 W, a bias power in the range of about 0 W to about 200 W, or an etching time in the range of about 5 seconds to about 100 seconds. This is an example, and other selective etching processes or process parameters are possible for the first selective etching process.

Figure 26A:
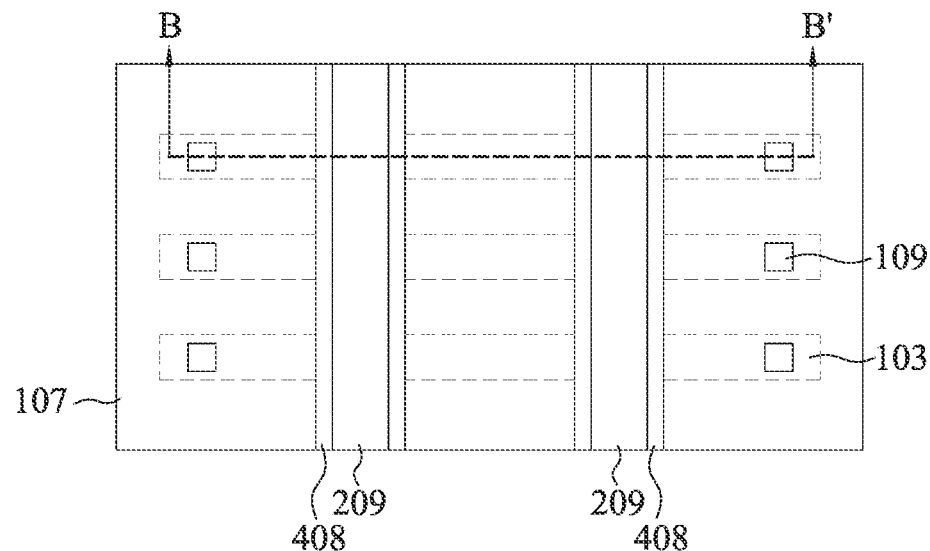
Figure 26B:
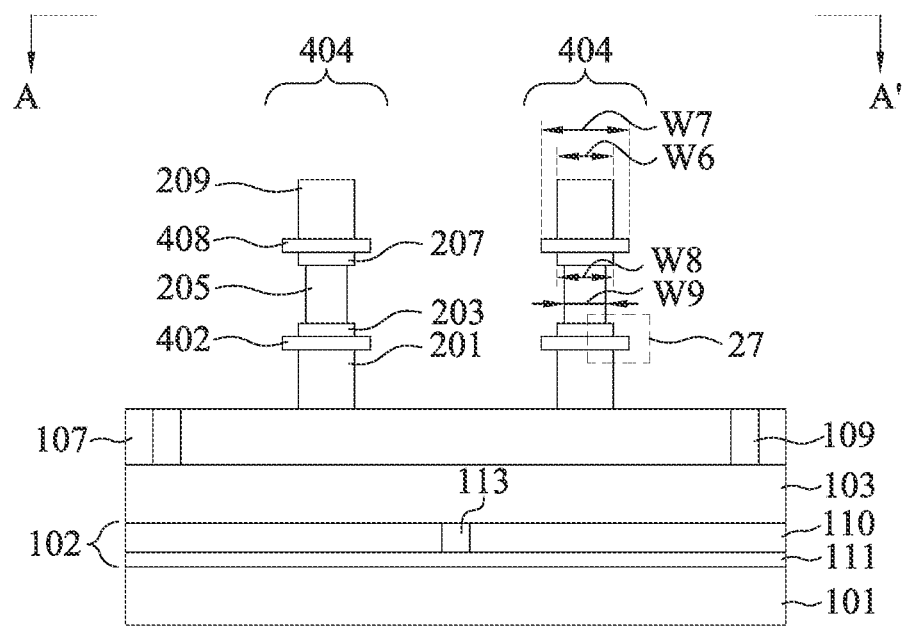

In FIGS. 26A-26B, a second selective etching process is performed on the bit line stacks 404 to recess sidewalls of the insulating layer 205, in accordance with some embodiments. The second selective etching process selectively etches surfaces of the insulating layer 205 over surfaces of the bit lines 201/209, adhesive layers 203/207 and electrodes 402/408, in some embodiments. For example, during the second selective etching process, the insulating layer 205 may be etched at a greater rate than the other layers of the bit line stacks 404. The second selective etching process may include one or more wet and/or dry etching processes. For example, the second selective etching process may comprise a wet dilute HF ("dHF") etch or the like. This is an example, and other selective etching processes are possible for the second selective etching process. In some embodiments, the second selective etching process is not performed.

In some embodiments, after performing the second selective etching process, the bit lines 201/209 have a width W6, the electrodes 402/408 have a width W7, the adhesive layers 203/207 have a width W8, and the insulating layer 205 has a width W9. In some cases, the width W6 of the first bit lines 201 may be different than the width W6 of the second bit lines 209. In some cases, the width W8 of the first adhesive layer 203 may be different than the width W8 of the second adhesive layer 207. In some embodiments, the width W9 of the insulating layer 205 is about the same as or less than the width W6 of the bit lines 201/209 and/or the width W8 of the adhesive layers 203/207. In some cases, the width W7 of the first electrodes 402 may be different than the width W7 of the second electrodes 408. In some embodiments, the width W7 of the electrodes 402/408 is greater than the width W6 of the bit lines 201/209, the width W8 of the adhesive layers 203/207, and/or the width W9 of the insulating layer 205. In some embodiments, the width W6 of the bit lines 201/209 is in the range of about 30 nm to about 90 nm, the width W7 of the electrodes 402/408 is in the range of about 40 nm to about 100 nm, the width W8 of the adhesive layers 203/207 is in the range of about 30 nm to about 90 nm, and the width W9 of the insulating layer 205 is in the range of about 20 nm to about 80 nm. Other widths are possible.

Figure 27A:
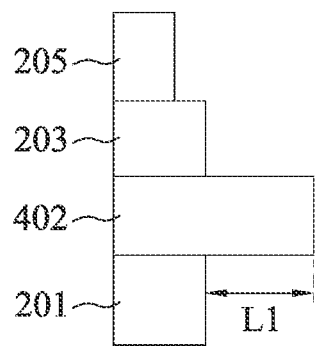
FIGS. 27A, 27B, and 27C illustrate magnified cross-sectional views of electrodes, in accordance with some embodiments.
Figure 27B:
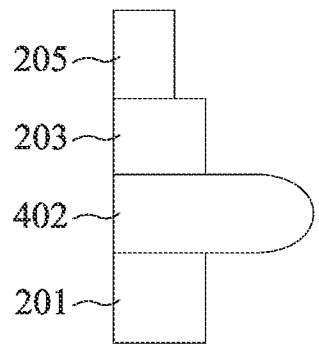
Figure 27C:
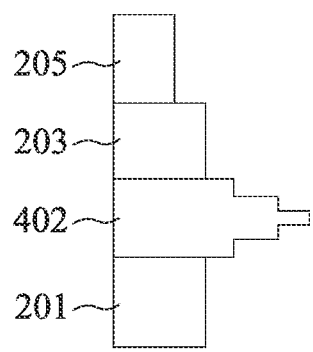

The protruding portions (e.g., the "tips") of the electrodes 402/408 may be formed having various profiles, which may provide advantages. As illustrative examples, FIGS. 27A-27C each show a magnified view of the region 27 indicated in FIG. 26B, which includes a protruding portion of a first electrode 402. As shown in FIG. 27A, the protruding portion of the first electrode 402 may protrude from the first bit line 201 a distance L1 that is in the range of about 5 nm to about 30 nm, though other distances are possible. As examples, FIG. 27A illustrates a first electrode 402 having a protruding portion with a flat end, FIG. 27B illustrates a first electrode 402 having a protruding portion with a rounded (e.g., convex) end, and FIG. 27C illustrates a first electrode 402 having a protruding portion with a stepped and tapering end, in accordance with some embodiments. These are examples, and electrodes 402/408 may have protruding portions with other profiles, such as pointed, tapered, irregular, angled, chamfered, concave, or having other shapes or profiles. In some embodiments, the profile of the protruding portions may be controlled by controlling parameters of the first selective etching process and/or the second selective etching process. In some cases, an electrode 402/408 having a relatively narrower tip end or a tapering tip end may allow for the formation of a more localized electrical field, which can improve device efficiency and reproducibility during operation (explained in greater detail below). While FIGS. 27A-27C show a protruding portion of a first electrode 402, the discussion is applicable to protruding portions of the first electrodes 402 or the second electrodes 408.

Figure 28A:
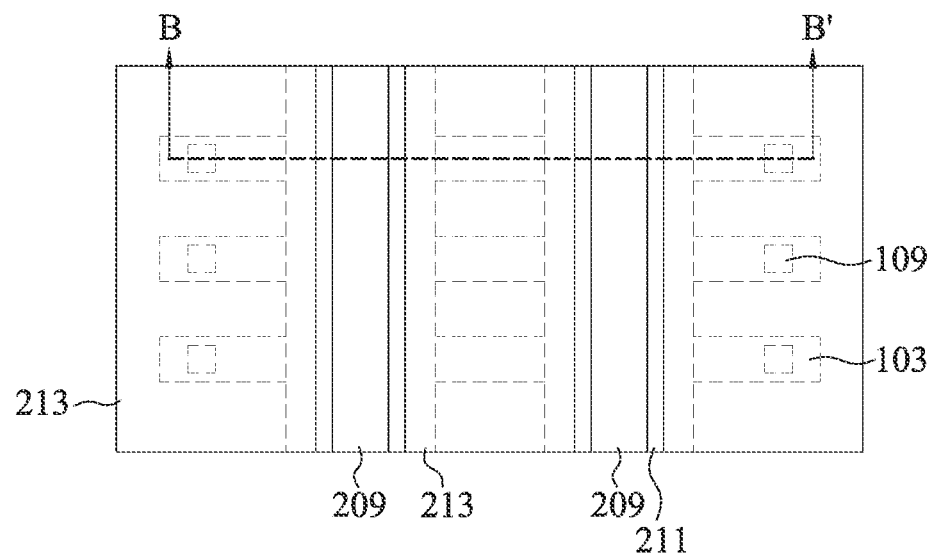
FIGS. 28A, 28B, 29A, and 29B illustrate plan views and cross-sectional views of intermediate steps in the manufacture of memory stacks of a memory structure with electrodes, in accordance with some embodiments.
Figure 28B:
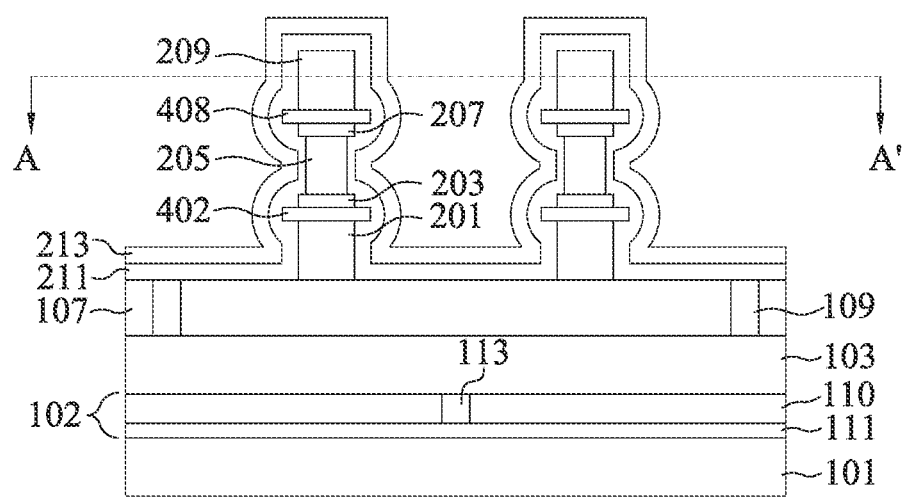
Figure 29A:
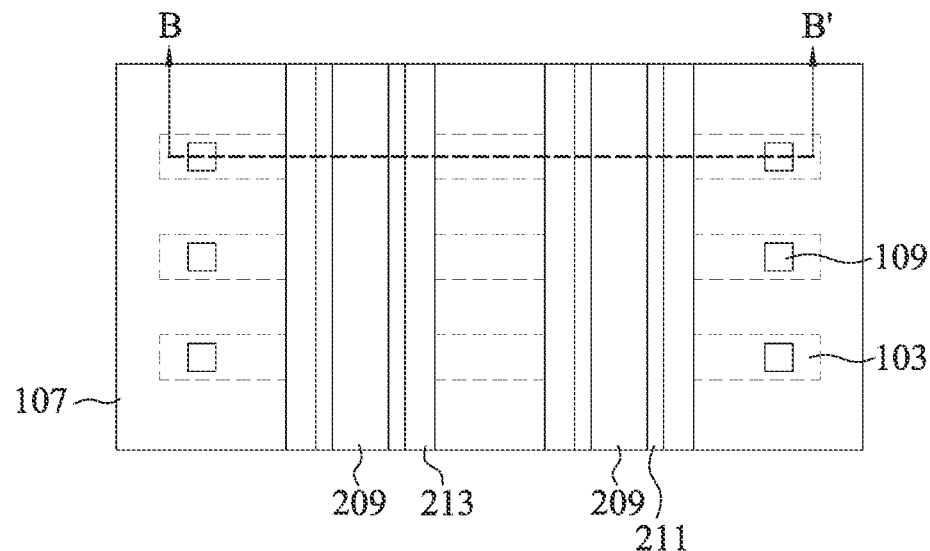
Figure 29B:
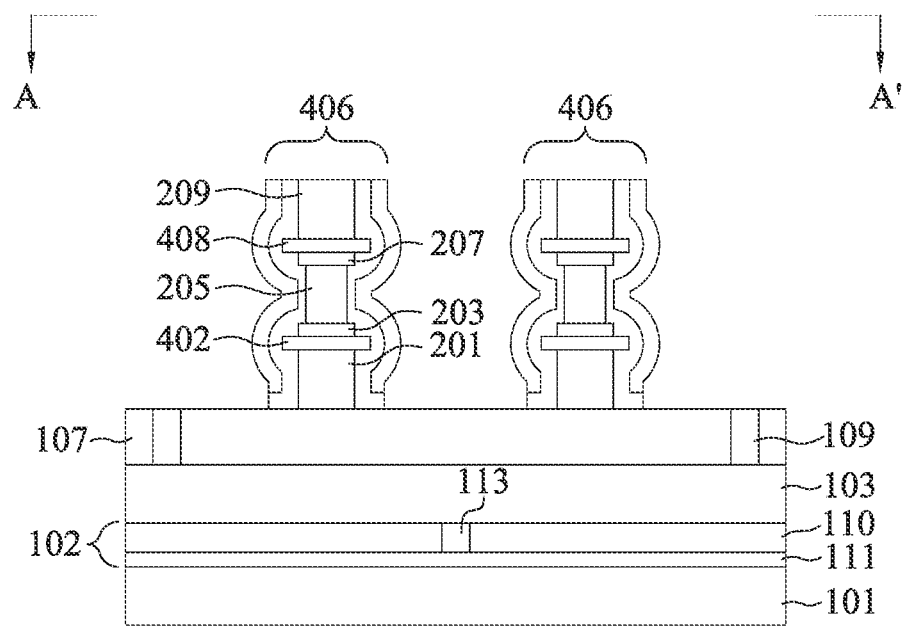

In FIGS. 28A-28B, a memory material 211 and a selector material 213 are deposited over the bit line stacks 404, in accordance with some embodiments. The memory material 211 and the selector material 213 may be similar to those described previously for FIGS. 4A-4B, and may be deposited using similar techniques. In some embodiments, the memory material 211 and/or the selector material 213 are deposited conformally over the bit line stacks 404. In FIGS. 29A-29B, one or more etching processes are performed to remove portions of memory material 211 and selector material 213 to form memory stacks 406, in accordance with some embodiments. The one or more etching process may be similar to those described previously for FIGS. 5A-5B. After the etching process(es), the bit line stacks 404 and the remaining memory material 211 and selector material 213 form the memory stacks 406. In other embodiments, the memory material 211 and the selector material 213 may be deposited and etched in separate steps, similar to the process described for FIGS. 18A-22B.

Figure 30A:
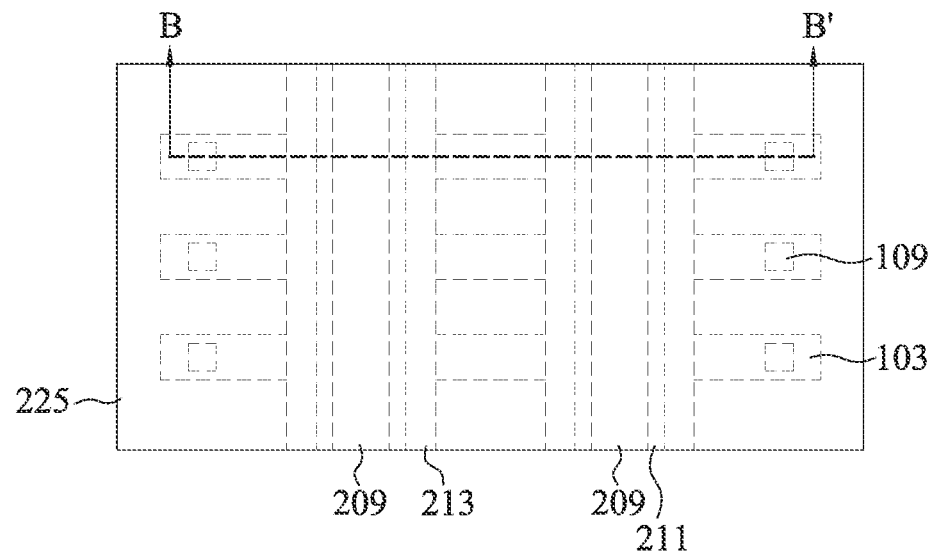
FIGS. 30A and 30B illustrate a plan view and a cross-sectional view of an intermediate step in the manufacture of control word lines of a memory structure with electrodes, in accordance with some embodiments.
Figure 30B:
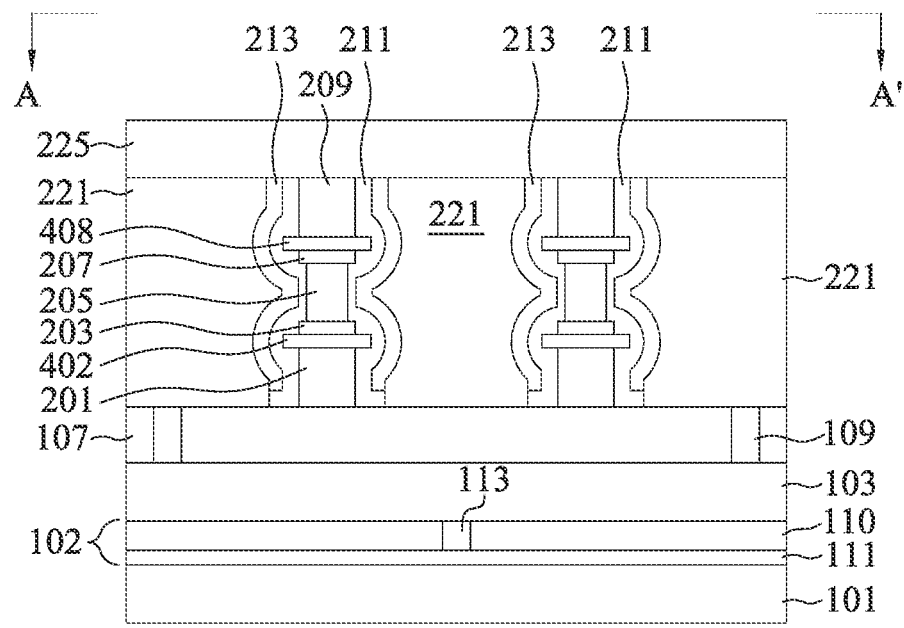

FIGS. 30A-30B illustrate the formation of control word lines 221 and a third dielectric layer 225, in accordance with some embodiments. The control word lines 221 may be similar to the control word lines 221 described previously for FIGS. 7A-7B, and may be formed using similar techniques. For example, the control word lines 221 may be formed on opposite sides of the memory stacks 406. The third dielectric layer 225 may be similar to the third dielectric layer 225 described previously for FIGS. 8A-8B, and may be formed using similar techniques. For example, the third dielectric layer 225 may be deposited over the memory stacks 406 and the control word lines 221.

Figure 31A:
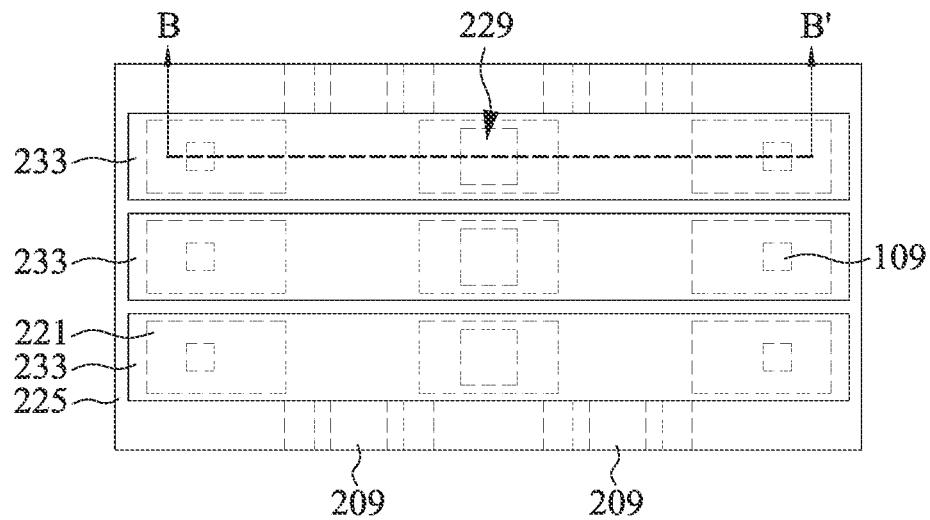
FIGS. 31A and 31B illustrate a plan view and a cross-sectional view of an intermediate step in the manufacture of second word lines of a memory structure with electrodes, in accordance with some embodiments.
Figure 31B:
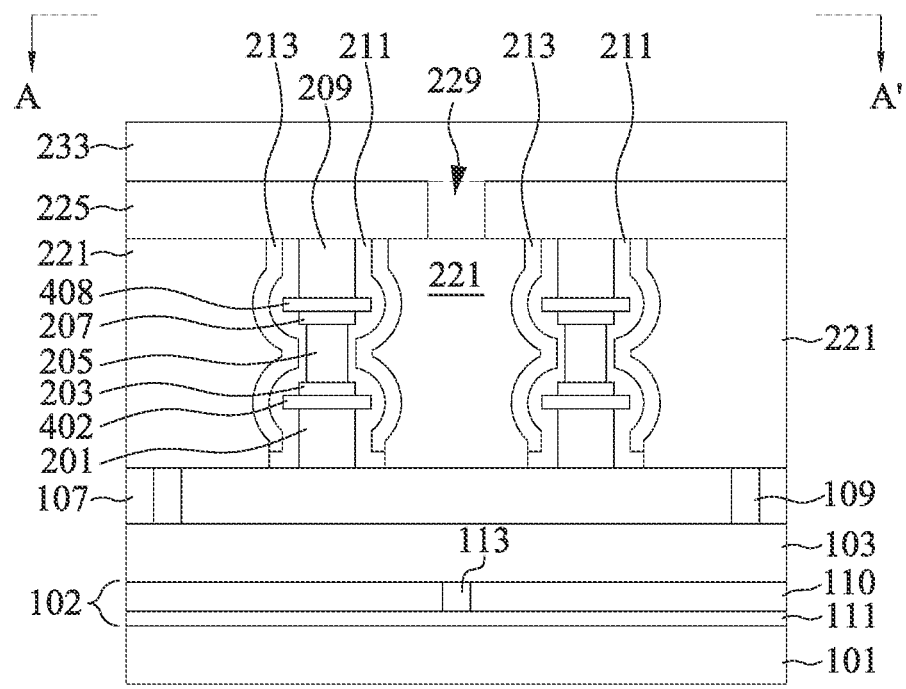

FIGS. 31A-31B illustrate the formation of second word lines 233, in accordance with some embodiments. The second word lines 233 may be similar to the second word lines 233 described previously for FIGS. 11A-11B, and may be formed in a similar manner. For example, the second word lines 233 may be connected to the control word lines 221 by second vias 229.

Figure 32A:
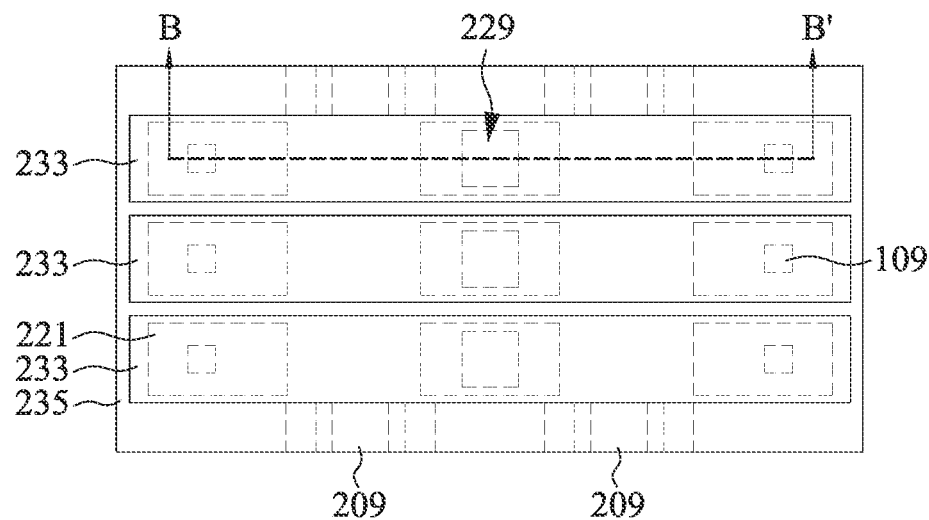
FIGS. 32A and 32B illustrate a plan view and a cross-sectional view of an intermediate step in the manufacture of a memory structure with electrodes, in accordance with some embodiments.
Figure 32B:
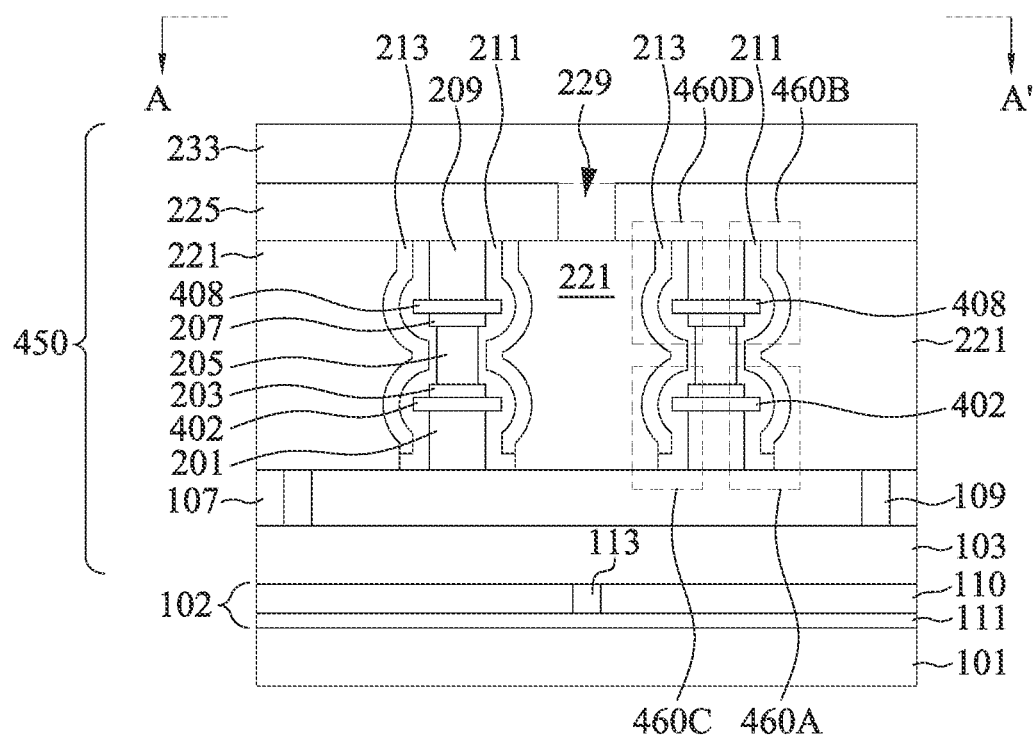

In FIGS. 32A-32B, a fourth dielectric layer 235 is deposited over the second word lines 233, forming a memory structure 450 having electrodes 402/408, in accordance with some embodiments. The fourth dielectric layer 235 may be similar to the fourth dielectric layer 235 described previously for FIGS. 12A-12D, and may be formed in a similar manner. In some embodiments, the memory structure 450 may be similar to the memory structure 250 shown in FIGS. 12A-12D, except for the inclusion of electrodes 402/408 and the layers within the bit line stacks 404 having varied widths. As shown in FIG. 32B, each memory stack 406 and its adjacent control word lines 221 form four memory cells 460A, 460B, 460C, and 460D.

The memory cells 460A-D may be controlled similarly to the memory cells 260A-D described for FIGS. 12C-12D. For example, read and write operations may be performed on particular memory cells 460 by applying appropriate voltage biases to corresponding first word lines 103, second word lines 233, and bit lines 201/209. The first electrodes 402 are electrically connected to the first bit lines 201, and the second electrodes 408 are electrically connected to the second bit lines 209. In some cases, during read/write operations, the electric fields formed near the ends of the electrodes 402/408 (e.g., near the tip ends) may be greater and/or more localized than the electric fields formed near sidewalls of the bit lines 201/209. Relatively larger electric fields may be formed near the ends of the electrodes 402/408 because the electrodes 402/408 are thinner than the bit lines 201/209 and because the ends of the electrodes 402/408 protrude outward from the bit line stacks 404. As described previously, for some types of resistive memory, the resistance state of a region of memory material within a memory cell may be changed by an electric field. Accordingly, within a memory cell 460, a relatively large electric field localized near an end of an electrode 402/408 can cause the resistance-changing region of memory material 211 to be localized near that end. By facilitating that the resistance-changing regions of memory cells 460 occur near the electrodes 402/408 in this manner, the read/write operations of the memory cells 460 may be more efficient, reliable, and/or reproducible. Thus, the embodiments described herein can achieve memory structures 450 having a greater density and greater device performance.

FIGS. 33A-33B illustrate a memory structure 452, in accordance with some embodiments. The memory structure 452 is similar to the memory structure 450 described for FIGS. 23A-32B, except that the hard mask 210 is left remaining on the bit line stacks 404. This is similar to the embodiment described previously for FIGS. 15A-17B. By leaving portions of the hard mask 210 on the bit line stacks 404, the distance between the second vias 229 and the second bit lines 209 may be increased, which can reduce the chance of leakage or shorting.

Embodiments described herein may achieve advantages. For example, by utilizing a memory structure having two overlapping bit lines with a shared control word line shared on each side of the two bit lines, the density of a memory array may be increased up to four times. Additionally, by utilizing two overlapping sets of word lines connected to the control word lines (e.g., one word line above the control word lines and one word line below the control word lines), the density of the memory array can be increased with little or no area penalty. In this manner, the density of a memory array may be increased without increasing the overall footprint of the memory array, in some cases. In some cases, the memory structures described herein may be incorporated within the BEOL layers (e.g., metallization layers) of a semiconductor device, and thus may be formed at lower cost and with fewer changes to existing manufacturing processes. In some embodiments, electrodes are formed in memory cells having protruding tips, which can help localize the resistance change regions in the memory cells. Localizing the resistance change regions in this manner can improve reproducibility, reduce variation, and increase operating efficiency of the memory array. The memory structures and memory arrays described herein may be formed without the formation of dummy or nonfunctional memory cells.

In accordance with an embodiment, a method of manufacturing a semiconductor device includes forming a first word line over a substrate; forming a bit line stack, including forming a first bit line over the first word line, wherein the first bit line includes a first material; forming an insulating layer over the first bit line; and forming a second bit line over the insulating layer, wherein the second bit line includes the first material; depositing a memory material on the bit line stack, wherein the memory material extends along a first sidewall of the bit line stack and extends along a second sidewall of the bit line stack; depositing a conductive material over the memory material, wherein a first portion of the conductive material along the first sidewall is electrically isolated from a second portion of the conductive material along the second sidewall; and forming a second word line over the conductive material, wherein the second word line is electrically connected to the second portion of the conductive material. In an embodiment, the method includes depositing an ovonic threshold switching (OTS) material on the memory material. In an embodiment, patterning the bit line stack includes using a patterned hard mask as an etching mask, and wherein the memory material is deposited on sidewalls of the patterned hard mask. In an embodiment, forming the bit line stack includes forming a first electrode on the first bit line, wherein the first electrode protrudes from the sidewalls of the first bit line; and forming a second electrode over the insulating layer, wherein the second bit line is formed on the second electrode, wherein the second electrode protrudes from the sidewalls of the second bit line. In an embodiment, the first electrode and the second electrode include a second material that is different from the first material, wherein forming the bit line stack further includes performing an etching process that selectively etches the first material over the second material. In an embodiment, the first material is tungsten and the second material is ruthenium. In an embodiment, the first word line is electrically connected to the first portion of the conductive material. In an embodiment, forming the bit line stack includes recessing the insulating layer using an etching process that selectively etches the insulating layer over the first material. In an embodiment, sidewalls of the first bit line, the insulating layer, and the second bit line are coplanar.

In accordance with an embodiment, a method includes forming first word lines over a substrate; forming memory stacks over the first word lines, wherein each memory stack includes a first sidewall and a second sidewall, wherein forming each memory stack includes forming a first bit line over at least one first word line; forming a second bit line over the first bit line, wherein the second bit line is electrically isolated from the first bit line; depositing a resistive memory layer along sidewalls of the first bit line and sidewalls of the second bit line; and depositing a selector layer on the resistive memory layer; forming control word lines on the memory stacks, wherein each control word line extends from the first sidewall of a first respective memory stack to the second sidewall of a second respective memory stack; and forming second word lines over the memory stacks and the control word lines, wherein each control word line is electrically connected to a first word line or a second word line. In an embodiment, forming each memory stack includes performing at least one etching processes to remove horizontal portions of the resistive memory layer and the selector layer. In an embodiment, after performing the one or more etching processes, the resistive memory layer has an "L-shaped" profile. In an embodiment, the first bit line includes a first electrode layer and the second bit line includes a second electrode layer, wherein the first electrode layer and the second electrode layer protrude laterally. In an embodiment, the first electrode layer and the second electrode layer have thicknesses in the range of 2 nm to 5 nm. In an embodiment, the first bit line includes a first adhesion layer and the second bit line includes a second adhesion layer. In an embodiment, the second bit line is electrically isolated from the first bit line by a layer of oxide.

In accordance with an embodiment, a semiconductor device includes a memory structure over a substrate, wherein the memory structure includes a first word line; a first bit line over the first word line; a second bit line over the first bit line; a memory material over sidewalls of the first bit line and the second bit line; a first control word line along a first side of the memory material, wherein the first control word line is electrically connected to the first word line; a second control word line along a second side of the memory material that is opposite the first side; and a second word line over the second bit line, the first control word line, and the second control word line, wherein the second word line is electrically connected to the second control word line. In an embodiment, the memory structure includes a first electrode contacting the first bit line and a second electrode contacting the second bit line, wherein the first electrode and the second electrode have a greater width than the first bit line and the second bit line. In an embodiment, the memory structure includes four separate memory cells. In an embodiment, the semiconductor device includes metallization layers over the substrate, wherein the memory structure is over the metallization layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a first word line over a substrate;
    forming a bit line stack, comprising:
        forming a first bit line over the first word line, wherein the first bit line comprises a first material;
        forming an insulating layer over the first bit line; and
        forming a second bit line over the insulating layer, wherein the second bit line comprises the first material; depositing a memory material on the bit line stack, wherein the memory material extends along a first sidewall of the bit line stack and extends along a second sidewall of the bit line stack;
    depositing a conductive material over the memory material, wherein a first portion of the conductive material along the first sidewall is electrically isolated from a second portion of the conductive material along the second sidewall; and
    forming a second word line over the conductive material, wherein the second word line is electrically connected to the second portion of the conductive material.

2. The method of claim 1 further comprising depositing an ovonic threshold switching (OTS) material on the memory material.

3. The method of claim 1, wherein patterning the bit line stack comprises using a patterned hard mask as an etching mask, and wherein the memory material is deposited on sidewalls of the patterned hard mask.

4. The method of claim 1, wherein forming the bit line stack further comprises:
forming a first electrode on the first bit line, wherein the first electrode protrudes from sidewalls of the first bit line; and
forming a second electrode over the insulating layer, wherein the second bit line is formed on the second electrode, wherein the second electrode protrudes from sidewalls of the second bit line.

5. The method of claim 4, wherein the first electrode and the second electrode comprise a second material that is different from the first material, wherein forming the bit line stack further comprises performing an etching process that selectively etches the first material over the second material.

6. The method of claim 5, wherein the first material is tungsten and the second material is ruthenium.

7. The method of claim 1, wherein the first word line is electrically connected to the first portion of the conductive material.

8. The method of claim 1, wherein forming the bit line stack further comprises recessing the insulating layer using an etching process that selectively etches the insulating layer over the first material.

9. The method of claim 1, wherein sidewalls of the first bit line, the insulating layer, and the second bit line are coplanar.

10. A method comprising:
forming first word lines over a substrate;
forming memory stacks over the first word lines, wherein each memory stack comprises a first sidewall and a second sidewall, wherein forming each memory stack comprises:
forming a first bit line over at least one first word line;
forming a second bit line over the first bit line, wherein the second bit line is electrically isolated from the first bit line;
depositing a resistive memory layer along sidewalls of the first bit line and sidewalls of the second bit line; and
depositing a selector layer on the resistive memory layer;
forming control word lines on the memory stacks, wherein each control word line extends from the first sidewall of a first respective memory stack to the second sidewall of a second respective memory stack; and
forming second word lines over the memory stacks and the control word lines, wherein each control word line is electrically connected to a first word line or a second word line.

11. The method of claim 10, wherein forming each memory stack further comprises performing at least one etching processes to remove horizontal portions of the resistive memory layer and the selector layer.

12. The method of claim 11, wherein after performing the one or more etching processes, the resistive memory layer has an "L-shaped" profile.

13. The method of claim 10, wherein the first bit line comprises a first electrode layer and the second bit line comprises a second electrode layer, wherein the first electrode layer and the second electrode layer protrude laterally.

14. The method of claim 13, wherein the first electrode layer and the second electrode layer have thicknesses in the range of 2 nm to 5 nm.

15. The method of claim 10, wherein the first bit line comprises a first adhesion layer and the second bit line comprises a second adhesion layer.

16. The method of claim 10, wherein the second bit line is electrically isolated from the first bit line by a layer of oxide.

17. A semiconductor device comprising:
a memory structure over a substrate, wherein the memory structure comprises:
a first word line;
a first bit line over the first word line;
a second bit line over the first bit line;
a memory material over sidewalls of the first bit line and the second bit line, wherein the memory material extends continuously from a sidewall of the first bit line to a sidewall of the second bit line;
a first control word line along a first side of the memory material, wherein the first control word line is electrically connected to the first word line;
a second control word line along a second side of the memory material that is opposite the first side; and
a second word line over the second bit line, the first control word line, and the second control word line, wherein the second word line is electrically connected to the second control word line.

18. The semiconductor device of claim 17, wherein the memory structure further comprises a first electrode contacting the first bit line and a second electrode contacting the second bit line, wherein the first electrode and the second electrode have a greater width than the first bit line and the second bit line.

19. The semiconductor device of claim 17, wherein the memory structure comprises four separate memory cells.

20. The semiconductor device of claim 17 further comprising a plurality of metallization layers over the substrate, wherein the memory structure is over the plurality of metallization layers.

* * * * *